(12) United States Patent
Schilp et al.

(10) Patent No.: US 7,257,524 B2
(45) Date of Patent: Aug. 14, 2007

(54) SIMULATION AND TIMING CONTROL FOR HARDWARE ACCELERATED SIMULATION

(75) Inventors: William John Schilp, Groton, MA (US); Pramodini Arramreddy, Lowell, MA (US); Krishna Babu Bangera, Nashua, NH (US); Makarand Yashwant Joshi, Merrimack, NH (US)

(73) Assignee: Quickturn Design Systems, Inc., San Jose, CA (US)

( * ) Notice: Subject to any disclaimer, the term of this patent is extended or adjusted under 35 U.S.C. 154(b) by 756 days.

(21) Appl. No.: 10/247,186

(22) Filed: Sep. 18, 2002

(65) Prior Publication Data

US 2003/0171908 A1    Sep. 11, 2003

Related U.S. Application Data

(60) Provisional application No. 60/323,586, filed on Sep. 19, 2001.

(51) Int. Cl.
*G06F 17/50* (2006.01)
*G06G 7/62* (2006.01)
*G06F 9/44* (2006.01)
*G06F 13/10* (2006.01)
*G06F 13/12* (2006.01)
*G06F 9/455* (2006.01)

(52) U.S. Cl. ............................ 703/14; 703/17; 703/21; 703/27

(58) Field of Classification Search .................. 703/27, 703/14
See application file for complete search history.

(56) References Cited

U.S. PATENT DOCUMENTS 6,134,516 A * 10/2000 Wang et al. .................. 703/27
6,175,946 B1 * 1/2001 Ly et al. ......................... 716/4
6,785,873 B1 * 8/2004 Tseng ............................. 716/4

* cited by examiner

*Primary Examiner*—Paul Rodriguez
*Assistant Examiner*—Juan Carlos Ochoa
(74) *Attorney, Agent, or Firm*—Orrick, Herrington & Sutcliffe LLP

(57) ABSTRACT

A fully synthesizeable Simulation Control Module (SCM) controls and monitors the simulation of a design under test (DUT). A clock generator within the SCM and a Software clock facility residing on the host workstation are responsible for providing the clocks for the DUT. The SCM and the hardware clock facility are dynamically generated at build time to suit the needs of the DUT. They maximize performance by automatically generating clock waveforms for designs containing multiple asynchronous clocks, thereby decreasing the frequency of accelerator-workstation interaction. The software clock facility has the ability to directly drive the DUT and is responsible for managing the simulation time and clock parameters. The SCM is also responsible for monitoring an abort condition such as a trigger to execute an external software model. The SCM and the clock facilities allow the hardware accelerator to efficiently support multiple asynchronous clock domains, execution of external software models and co-simulation.

28 Claims, 26 Drawing Sheets

TRANSITION TABLE FOR SCM FSM – OVERSAMPLING MODE

| CURRENT STATE | INPUTS | NEXT STATE | OUTPUTS | NOTES |
|---|---|---|---|---|
| IDLE: 0 (000) | 0 - - - - | IDLE: 0 (000) | 001 | STAYS IN IDLE STATE SINCE NO DSTARTEDGE |
| IDLE: 0 (000) | - - 1 - - | IDLE: 0 (000) | 001 | STAYS IN IDLE STATE SINCE DONE IS HIGH |
| IDLE: 0 (000) | 1-00- | O/S: 1 (001) | 010 | GOES TO OVERSAMPLING IN RESPONSE TO THE DSTARTEDGE AND DONE AND ABORT CONDITION NOT BEING HIGH. |
| IDLE: 0 (000) | 1-011 | A/R: 2 (010) | 110 | ABORT GOES HIGH AS CONTROL RETURNS FROM HOST WITH DSTARTEDGE. TRANSITION: IDLE TO ABORT RUNNING IF IN ABORT RUNNING MODE SIGNALED BY THE DABORTRUNMODE INPUT. IN THIS CASE, THE SCM GOES TO THE ABORT RUNNING STATE, COMPLETES ONE SET OF OVERSAMPLE CYCLES AND RETURNS THE CONTROL BACK TO THE HOST BY RAISING THE EISTOPPED OUTPUT HIGH. |

TRANSITION TABLE FOR SCM FSM – OVERSAMPLING MODE (A)

| CURRENT STATE | INPUTS | NEXT STATE | OUTPUTS | NOTES |
|---|---|---|---|---|
| IDLE: 0 (000) | 1-010 | ABORTED: 3 (011) | 101 | ABORT GOES HIGH AS CONTROL RETURNS FROM HOST WITH DSTART EDGE (ASSUMPTION: DONEPHASE WILL ALWAYS BE HIGH WHEN IN IDLE STATE). TRANSITION: IDLE TO ABORTED. NOTE: OABORT HAS BEEN DELAYED BY ONE FCLK TO ELIMINATE ASYNCH LOOP. THEREFORE A RISING EDGE ON DONEPHASE IMPLIES THAT THE REQUIRED OVERSAMPLE CYCLES AFTER THE OABORT GOING HIGH HAVE BEEN COMPLETED AND THE FSM SHOULD NOW DIRECTLY MOVE TO THE ABORTED STATE.<br><br>RISING IN THIS CASE THE SCM GOES TO THE ABORT RUNNING STATE, COMPLETES ONE SET OF OVERSAMPLE CYCLES AND RETURNS THE CONTROL BACK TO THE HOST BY RAISING THE EISTOPPED OUTPUT HIGH. |
| O/S: 1 (001) | -110- | IDLE: 0 (000) | 001 | DONE SIGNAL CAUSES FSM TO MOVE FROM OVERSAMPLING STATE TO IDLE. Q: CAN FSM MOVE OUT OF THE OVERSAMPLING STATE IN BETWEEN THE EXECUTION OF OVERSAMPLE CYCLES. ANS. NO. IT IS HOWEVER SAFE TO ASSUME THAT DONE WILL ALWAYS COINCIDE WITH A START PHASE SIGNAL THAT IS RAISED ONLY AT THE POINT WHEN A SET OVERSAMPLE CYCLES IS COMPLETED. |
| O/S: 1 (001) | -010- | O/S: 1 (001) | 000 | PRECAUTION: FSM WILL NOT MOVE OUT OF THE OVERSAMPLING STATE IN BETWEEN THE EXECUTION OF OVERSAMPLE CYCLES EVEN IF DONE GOES HIGH. |

FIG. 15B          TO (B) ON FIG. 15C (B) TRANSITION TABLE FOR SCM FSM – OVERSAMPLING MODE

| CURRENT STATE | INPUTS | NEXT STATE | OUTPUTS | NOTES |
|---|---|---|---|---|
| O/S: 1 (001) | -100- | O/S: 1 (001) | 010 | IN THE OVERSAMPLING STATE, DONEPHASE RETRIGGERS COUNTING DOWN OF ANOTHER SET OF OVERSAMPLE CYCLES BY ASSERTING THE ISTARTPHASE PIN. THIS ALSO CAUSES THE CLK FACILITY TO ADVANCE TIME. |
| O/S: 1 (001) | -000- | O/S: 1 (001) | 000 | THIS IMPLIES THE OVERSAMPLER IS COUNTING DOWN; NO ACTION OR TRANSITION REQUIRED. |
| O/S: 1 (001) | -0-1- | A/P: 4 (100) | 000 | IF THE ABORT COMES IN THE MIDDLE OF A SET OF OVERSAMPLE CYCLES GO TO THE ABORT PENDING STATE AND COMPLETE THE CURRENT SET BEFORE MOVING TO THE ABORTED STATE. |
| O/S: 1 (001) | -1-1- | ABORTED: 3 (011) | 101 | IF THE ABORT COMES RIGHT AT THE END OF THE CURRENT SET OF OVERSAMPLE CYCLES, GO TO THE ABORTED STATE. |
| | | | | |
| A/R: 2 (010) | 1-100 | IDLE: 0 (000) | 001 | DSTARTEDGE AND DONE GOING HIGH CAUSES TRANSITION TO IDLE STATE SINCE DABORTRUNMODE IS LOW. |
| A/R: 2 (010) | 1-000 | O/S: 1 (001) | 010 | DSTARTEDGE HIGH AND DONE AND ABORT LOW CAUSES TRANSITION TO OVERSAMPLING STATE WITH A TRIGGER VIA SETTING ISTARTPHASE HIGH. |
| A/R: 2 (010) | 0---- | A/R: 2 (010) | 100 | NO EDGE ON DSTART HOLDS IT IN ABORT RUNNING. |

© TRANSITION TABLE FOR SCM FSM – OVERSAMPLING MODE

| CURRENT STATE | INPUTS | NEXT STATE | OUTPUTS | NOTES |
|---|---|---|---|---|
| A/R: 2 (010) | 1 - - - 1 | A/R: 2 (010) | 110 | AS LONG AS DABORTRUNMODE INPUT IS HIGH, EVEN IF THERE IS AN EDGE ON DSTART, SCM STAYS IN ABORT RUNNING MODE. WHEN IN ABORT RUNNING MODE, WITH EVERY DSTARTEDGE A SET OF LEVEL-SENSITIVE OVERSAMPLE CYCLES IS INITIATED. AFTER RUNNING THE OVERSAMPLE CYCLES, EISTOPPED GOES HIGH TRANSFERRING CONTROL BACK TO THE HOST. THIS IS ACHIEVED TO SPECIAL CIRCUITRY NOT SHOWN AS A PART OF THE FSM BEHAVIOR HERE. |
| A/R: 2 (010) | 1 - - 10 | ABORTED: 3 (011) | 101 | DABORTRUNMODE INPUT BEING LOW AT A DSTART EDGE, AN ABORT CONDITION CAUSES IT TO MOVE TO THE ABORTED STATE AND TRANSFERS CONTROL BACK TO THE HOST. IF RUNNING OF THE PREVIOUS OVERSAMPLE CYCLES HAS CLEARED THE ABORT CONDITION, WHEN THE HOST CHECKS FOR THE ACTIVE C-MODEL ENABLES IT WILL NOT FIND ANY AND TRANSFER CONTROL BACK TO THE ACCELERATOR WITH A DSTARTEDGE AT WHICH POINT THE FSM MOVES INTO THE OVERSAMPLING STATE AND CONTINUES SIMULATION. IT WAS DECIDED THAT MAKING CONTROL GO BACK TO THE HOST AND RETURN TO THE ACCELERATOR WAS ACCEPTABLE. ALTERNATIVELY, IT CAN BE DETERMINED THAT THE ABORT CONDITION WAS CLEARED BEFORE TRANSFERRING THE CONTROL TO THE HOST. |
| | | | | |

(D) TRANSITION TABLE FOR SCM FSM – OVERSAMPLING MODE

| CURRENT STATE | INPUTS | NEXT STATE | OUTPUTS | NOTES |
| --- | --- | --- | --- | --- |
| ABORTED: 3 (011) | 1-1-0 | IDLE: 0 (000) | 001 | IF A DAS TRANSFER ASSOCIATED WITH THE CONTROL BEING RETURNED FROM THE HOST, CAUSES A HIGH ON DONE IGNORE THE OABORT AND THE FSM MOVES TO IDLE STATE, SINCE WE'RE DONE. |
| ABORTED: 3 (011) | 1-0-0 | O/S: 1 (001) | 010 | IF ABORT CONDITION CLEARS AND MORE CYCLES NEED TO BE RUN (DONE !=1) GO TO OVERSAMPLING STATE WITH A TRIGGER VIA ISTARTPHASE. IF ABORT CONDITION DID NOT CLEAR BY THE PRECEDING SET OF OVERSAMPLE CYCLES OR BY THE DAS TRANSFER DEPOSIT AND DABORTRUNMODE INPUT IS LOW, GO TO OVERSAMPLING STATE. IF RUNNING ONE SET OF OVERSAMPLE CYCLES DOES NOT CLEAR THE ABORT CONDITION, THE FSM WILL MOVE BACK TO THE ABORTED STATE VIA THE ABORT PENDING STATE. ALSO TRIGGER THE OVERSAMPLE CYCLES BY RAISING ISTARTPHASE HIGH. |
| ABORTED: 3 (011) | 1---1 | A/R: 2 (010) | 110 | IF ABORTRUNMODE INPUT IS HIGH, GO TO ABORT RUNNING STATE, REGARDLESS OF WHETHER ABORT CONDITION HAS CLEARED OR NOT. EABORTED IS RAISED TO INDICATE THAT IT IS IN AN ABORTED OR ABORT RUNNING STATE AND ISTARTPHASE IS USED TO TRIGGER A SET OF OVERSAMPLE CYCLES, EISTOPPED IS PULLED LOW TO ALLOW ONE SET OF OVERSAMPLE CYCLES TO BE RUN. |
| ABORTED: 3 (011) | 0---- | ABORTED: 3 (011) | 101 | IF NO DSTARTEDGE, STAY HERE. |

FIG. 15E

(E) TRANSITION TABLE FOR SCM FSM – OVERSAMPLING MODE

| CURRENT STATE | INPUTS | NEXT STATE | OUTPUTS | NOTES |
|---|---|---|---|---|
| A/P: 4 (100) | -1--- | ABORTED: 3 (011) | 101 | TRANSITION TO ABORTED WHEN THE CURRENT SET OF OVERSAMPLE CYCLES IS COMPLETED, SIGNALED BY THE DONEPHASE GOING HIGH. |
| A/P: 4 (100) | -0--- | A/P: 4 (100) | 000 | STAY PUT UNTIL DONEPHASE GOES HIGH. |

FIG. 15F

TRANSITION TABLE FOR SCM FSM – DIRECT MAPPED MODE

| CURRENT STATE | INPUTS | NEXT STATE | OUTPUTS | NOTES |
|---|---|---|---|---|
| IDLE: 0 (00) | 0--- | IDLE: 0 (00) | 001 | STAYS IN IDLE STATE SINCE NO DSTARTEDGE |
| IDLE: 0 (00) | 11-- | IDLE: 0 (00) | 001 | STAY IN IDLE STATE SINCE DONE IS HIGH |
| IDLE: 0 (00) | 100- | O/S: 1 (01) | 010 | GOES TO OVERSAMPLING IN RESPONSE TO THE DSTARTEDGE AND DONE AND ABORT CONDITION NOT BEING HIGH. |
| IDLE: 0 (00) | 1011 | A/R: 2 (11) | 110 | ABORT GOES HIGH AS CONTROL RETURNS FROM HOST WITH DSTARTEDGE. TRANSITION: IDLE TO ABORT RUNNING IF IN ABORT RUNNING MODE SIGNALED BY THE DABORTRUNMODE INPUT BEING HIGH. IN THIS CASE, THE SCM GOES TO THE ABORT RUNNING STATE, COMPLETES ONE SET OF OVERSAMPLE CYCLES AND RETURNS THE CONTROL BACK TO THE HOST BY RAISING THE EISTOPPED OUTPUT HIGH. |
| IDLE: 0 (00) | 1010 | ABORTED: 3 (11) | 101 | ABORT GOES HIGH AS CONTROL RETURNS FROM HOST WITH DSTARTEDGE. TRANSITION: IDLE TO ABORTED IF NOT IN ABORT RUNNING MODE SIGNALED BY THE DABORTRUNNINGMODE INPUT BEING LOW. IN THIS CASE THE SCM GOES TO THE ABORTED STATE AND RETURNS THE CONTROL BACK TO THE HOST BY RAISING THE EISTOPPED OUTPUT HIGH. |
| | | | | |

(A) TRANSITION TABLE FOR SCM FSM – DIRECT MAPPED MODE

| CURRENT STATE | INPUTS | NEXT STATE | OUTPUTS | NOTES |
|---|---|---|---|---|
| O/S: 1 (01) | -10- | IDLE: 0 (00) | 001 | DONE SIGNAL CAUSES FSM TO MOVE FROM OVERSAMPLING STATE TO IDLE. Q: CAN FSM MOVE OUT OF THE OVERSAMPLING STATE IN BETWEEN THE EXECUTION OF OVERSAMPLE CYCLES. ANS. NO. SINCE EACH FCLK CYCLE IN DIRECT MAPPED MODE REPRESENTS ONE USER CLOCK, THE DONEPHASE SIGNAL WILL ALWAYS BE HIGH. HENCE, FSM MOVES TO THE IDLE STATE ONLY AT THE END OF THE SET OF OVERSAMPLING CYCLES (#=1). |
| O/S: 1 (01) | -00- | O/S: 1 (01) | 010 | IN THE OVERSAMPLING STATE, EVERY FCLK CYCLE THE FSM RE-TRIGGERS COUNTING DOWN OF ANOTHER SET OF OVERSAMPLE CYCLES BY ASSERTING THE ISTARTPHASE PIN. THIS ALSO CAUSES THE CLK FACILITY TO ADVANCE TIME. |
| O/S: 1 (01) | --1- | ABORTED: 3 (11) | 101 | IN DIRECT MAPPED MODE, ABORT ALWAYS COMES AT THE END OF THE SET OF OVERSAMPLE CYCLES. IN THE EVENT OF AN ABORT, FSM IMMEDIATELY MOVES TO THE ABORTED STATE AND RAISES EABORTED AND EISTOPPED HIGH INITIATING THE TRANSFER OF CONTROL TO THE HOST. |
| | | | | |
| A/R: 2 (10) | 1100 | IDLE: 0 (00) | 001 | DSTARTEDGE AND DONE GOING HIGH CAUSES TRANSITION TO IDLE STATE, SINCE DABORTRUNMODE IS LOW |
| A/R: 2 (10) | 1000 | O/S: 1 (01) | 010 | DSTARTEDGE HIGH AND DONE AND ABORT LOW CAUSES TRANSITION TO OVERSAMPLING STATE WITH A TRIGGER VIA SETTING ISTARTPHASE HIGH. |

(B) TRANSITION TABLE FOR SCM FSM – DIRECT MAPPED MODE

| CURRENT STATE | INPUTS | NEXT STATE | OUTPUTS | NOTES |
|---|---|---|---|---|
| A/R: 2 (10) | 0 - - - | A/R: 2 (10) | 100 | NO EDGE ON DSTART HOLDS IT IN ABORT RUNNING. |
| A/R: 2 (10) | 1 - - 1 | A/R: 2 (10) | 110 | AS LONG AS DABORTRUNMODE INPUT IS HIGH, EVEN IF THERE IS AN EDGE ON DSTART, SCM STAYS IN ABORT RUNNING MODE. WHEN IN ABORT RUNNING MODE, WITH EVERY DSTARTEDGE A SET OF LEVEL-SENSITIVE OVERSAMPLE CYCLES IS INITIATED. AFTER RUNNING THE OVERSAMPLE CYCLES, EISTOPPED GOES HIGH TRANSFERRING CONTROL BACK TO THE HOST. THIS IS ACHIEVED TO SPECIAL CIRCUITRY NOT SHOWN AS A PART OF THE FSM BEHAVIOR HERE. |
| A/R: 2 (10) | 1-10 | ABORTED: 3 (11) | 101 | DABORTRUNMODE INPUT BEING LOW ON A DSTART EDGE, AN ABORT CONDITION CAUSES IT TO MOVE TO THE ABORTED STATE AND RAISING THE EISTOPPED OUTPUT HIGH TRANSFERS CONTROL BACK TO THE HOST. |
| ABORTED: 3 (11) | 11-0 | IDLE: 0 (00) | 001 | IF A DAS TRANSFER ASSOCIATED WITH THE CONTROL BEING RETURNED FROM THE HOST CAUSES A HIGH ON DONE IGNORE THE OABORT AND THE FSM MOVES TO IDLE STATE SINCE WE'RE DONE. |
| ABORTED: 3 (11) | 10-0 | O/S: 1 (01) | 010 | IF MORE CYCLES NEED TO BE RUN (DONE=0) GO TO OVERSAMPLING STATE WITH A TRIGGER VIA ISTARTPHASE. |

© TRANSITION TABLE FOR SCM FSM – DIRECT MAPPED MODE

| CURRENT STATE | INPUTS | NEXT STATE | OUTPUTS | NOTES |
|---|---|---|---|---|
| ABORTED: 3 (11) | 1 - - 1 | A/R: 2 (10) | 110 | IF ABORTRUNMODE INPUT IS HIGH, GO TO ABORT RUNNING STATE, REGARDLESS OF WHETHER ABORT CONDITION HAS CLEARED OR NOT. EABORTED IS RAISED TO INDICATE THAT IT IS IN AN ABORTED OR ABORT RUNNING STATE AND ISTARTPHASE IS USED TO TRIGGER A SET OF OVERSAMPLE CYCLES, EISTOPPED IS PULLED LOW TO ALLOW ONE SET OF OVERSAMPLE CYCLES TO BE RUN. |
| ABORTED: 3 (11) | 0 - - - | ABORTED: 3 (11) | 101 | IF NO DSTARTEDGE, STAY HERE. |

FIG. 16D

SIMULATION AND TIMING CONTROL FOR HARDWARE ACCELERATED SIMULATION

RELATED APPLICATION INFORMATION

This application claims the benefit of US Provisional Application No. 60/323,586, filed on Sep. 19, 2001, titled "Simulation Control Module and Hardware Clock Facility".

FIELD OF THE INVENTION

This invention relates to electronic systems, and more particularly to systems and methods for performing accelerated hardware simulation of electronic system designs.

BACKGROUND

Modern electronic systems are frequently implemented as a combined hardware/software system built on a single silicon chip. In order to ensure that these chips will function properly, it is useful to test the full-system design of the electronic system, before incurring the expenses of actually creating the physical silicon chips. The full-system designs are typically tested by implementing the design in a simulator, and then running a simulated operation of the design. With the ability to mix processors, complex peripherals and custom hardware and software on a single chip, full-system design and analysis places an ever increasing demand on the simulators, to speed up the simulation process.

Conventional hardware accelerated simulators are composed of a hardware accelerator box, which contains the hardware components used to implement the design-under-test (DUT), and a host workstation which is used to control the simulated operation of the DUT. The host workstation has a variety of software routines used to interface with the hardware accelerator box and perform other desired functions in the simulation process. For example, the host workstation provides all of the various design clock signals used to provide timing for the various elements of the DUT. In the DUT, events only occur when one of the design clocks changes state, referred to as a design clock "edge". The host workstation may also contain software implemented models of certain portions of the full-system design, such as C-models, which are software models of particular circuits, written in a high-level language such as the C programming language. These software models interact with the hardware DUT as desired by the system designer.

Since conventional hardware accelerated simulators rely on the host workstation for all control functions, the operating speed of the simulator is limited by the operating speed of the software executing on the host workstation, which is typically much slower than the maximum operating speed of the hardware components in the hardware accelerator box.

There is an additional inefficiency in conventional hardware accelerated simulators, when the DUT uses multiple asynchronous design clocks. Asynchronous clocks are clocks that do not change states at the same moment in time. In order to ensure that the DUT is properly simulated, it is necessary to have the simulator evaluate the DUT on every design clock edge. Therefore the simulation clock used to time the evaluations performed by the simulator needs to be configured such that a simulation clock edge occurs whenever a design clock edge occurs. Conventional hardware accelerated simulators compute the least common denominator (LCD) of the phase lengths of the multiple asynchronous design clocks, and use this LCD as the phase length of the simulation clock (the simulator performs a simulation action every time the simulation clock changes state).

For example, assume the DUT has two, two-phase design clocks, a first design clock with a phase length of two time units, and a second design clock with a phase length of three time units. Thus, the first design clock has edges every two time units (2, 4, 6, 8, etc.), and the second design clock has edges every three time units (3, 6, 9, 12, etc). The LCD of these two phase lengths is one, therefore the simulation clock edges occur every one time units apart. This will guarantee that the simulator will evaluate the DUT every time something happens in the DUT. However, the simulator will also evaluate the DUT at times when there has been no design clock edge, and therefore nothing has happened in the DUT. For example, at time one and again at time five, neither of the design clocks are at an edge, but the simulation clock still evaluates the DUT.

Therefore, there is a need for improved systems and methods of controlling simulations of a DUT, with reduced interaction between the hardware accelerator box and the host workstation, and with increased efficiency of DUT evaluations by the simulator.

SUMMARY OF THE INVENTION

In an aspect of an embodiment of the invention, simulation control of a design-under-test (DUT) is performed by a hardware simulation control module.

In another aspect of an embodiment of the invention, multiple asynchronous design clocks are managed by the hardware simulation control module.

In another aspect of an embodiment of the invention, a DUT having multiple asynchronous design clocks is simulated only on a design clock edge.

In another aspect of an embodiment of the invention, a hardware simulation control module processes abort signals generated by the DUT.

In another aspect of an embodiment of the invention, the hardware simulation control module is dynamically generated at build time of the simulation.

In another aspect of an embodiment of the invention, a hardware clock facility provides a plurality of asynchronous design clocks.

In another aspect of an embodiment of the invention, a software clock facility is adapted to bypass the hardware clock facility.

In another aspect of an embodiment of the invention, a software clock facility interfaces with a hardware simulation control module via a software interface.

BRIEF DESCRIPTION OF THE DRAWINGS

The accompanying drawings are included to provide a further understanding of embodiments of the invention and together with the Detailed Description, serve to explain the principles of the embodiments disclosed.

FIG. 15 shows a transition table for the finite state machine operating in oversampling mode.

FIG. 16 shows a transition table for the finite state machine operating in direct-mapped mode.

DETAILED DESCRIPTION OF THE PREFERRED EMBODIMENTS

Figure 1:
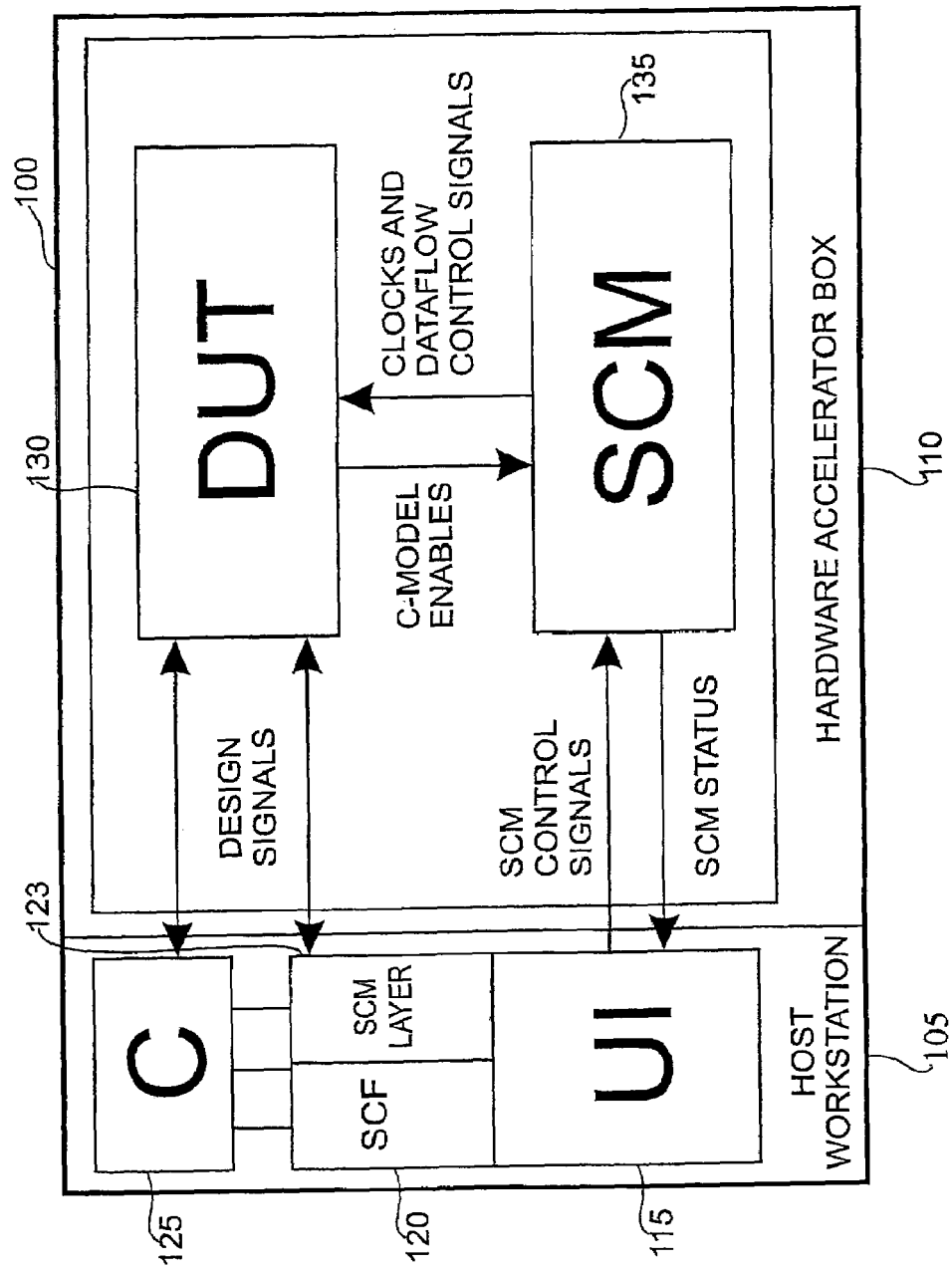
FIG. 1 shows a simulator according to an embodiment of the invention.

Turning to FIG. 1, a simulator 100 in accordance with an embodiment of the invention includes a host workstation 105 and a hardware accelerator box 110. The host workstation 105 is a computer adapted to operate software used in interfacing with, controlling, and responding to the various systems with the hardware accelerator box 110.

The hardware accelerator box 110 is the hardware platform onto which the hardware portion of a full-system design is configured for simulation. The hardware accelerator box 110 is composed of a collection of programmable devices such as programmable logic arrays (PLAs), field programmable gate arrays (FPGAs), or other similar devices. These devices are adapted to be configured by the host workstation 105, such that the devices embody the hardware portion of a full-system design, such as the design-under-test (DUT) 130. These devices additionally are adapted to be configured by the host workstation 105 to embody any desired circuitry, such as the simulation control module (SCM) 135, used to interface between the host workstation 105 and the DUT 130.

The host workstation 105 contains a user interface 115, a software clock facility 120, a simulation control module layer 123, and a collection of C-models 125. The user interface 115 is a software module adapted to provide an interface between a user such as a design or test engineer and the simulator 10. The user interface 115 accepts inputs from the user, manipulates these inputs as desired by the design parameters provided by the user or from other sources, provides data, control signals, commands and the like to the hardware accelerator box 110, accepts outputs from the hardware accelerator box 110, manipulates these outputs as desired by the design parameters specified by the user or others, and provides the outputs to the user. The user interface 115 also interfaces with the software clock facility 120, the SCM layer 123, the collection of C-models 125, and any other components of the simulator 100, as desired by the user.

The software clock facility 120 is a software module responsible for generating various clock signals used in controlling the timing of events in the various circuits of the DUT 130. The software clock facility 120 generates "design clock" signals used to control the DUT 130, as well as a "simulation clock" signal, used to control the simulation process. As discussed in detail below, the circuits of the DUT 130 can also be controlled by design clocks implemented in hardware, in the SCM 135, and the simulation process can also be controlled using a simulation clock implemented in hardware. A clock, in general, is an electronic signal that alternates between two voltage levels over time, according to a repeating pattern. Each voltage level is termed a clock "phase". A successive combination of a high and a low phase, in either order, is termed a clock "cycle". The details of the software clock facility 120 are discussed below.

The SCM layer 123 is a software module which provides a uniform interface that hides from the other modules of the host workstation 105 the details of how the SCM 135 is used, whether the SCM 135 is in use or has been bypassed, and even whether an SCM 135 exists in the simulator 100 at all. The SCM layer 123 is integrated with the software clock facility 120, where the SCM layer 123 is used as a component of the implementation of the software clock facility 120. The SCM layer 123 is discussed in more detail below.

The C-models 125 are a collection of software modules which embody the various software portions of the full-system design being simulated by the simulator 100. The C-models are accessed by the DUT 130 at various points during the simulation, as necessary to accurately simulate the full-system design. In alternate embodiments where the full-system design is implemented solely in hardware, the simulator 100 contains no C-models 125.

The DUT 130 is the hardware portion of the full-system design being simulated on the simulator 100. The DUT 130 may be the hardware portion of any of a vast number of electronic systems. For example, the DUT 130 may be the hardware portion of a cellular telephone, or may be a controller for an automobile ignition system. The particular details of the DUT 130 are not critical to the disclosed embodiments of the invention.

During simulation, various design signals are sent between the DUT 130 and the host workstation 105. These signals include inputs to the DUT 130 from the user interface 115 or from one or more of the collection of C-models 125, as well as outputs from the DUT 130 to either the user interface 105 or the C-models 125. The specific details of these signals are dependent on the particular design being simulated, and on particular requests made by the user and/or the host workstation 105.

The SCM 135 is the instrumentation and control logic which is added alongside the DUT 130 when the circuitry in the hardware accelerator box 110 is configured. The SCM 135 is dynamically constructed at build time, to match the specifications of the DUT 130, using the programmable devices in the hardware accelerator box 110. The SCM 135 is responsible for control, simulation and monitoring of the DUT 130 with minimal external intervention from the host workstation 105. Simulating refers to the high-level process of causing the simulation process to move forward, for example by monitoring signals, gathering data, or stimulating the design. Stimulating refers to the application of input data to the DUT 130. The host workstation 105 interacts with the SCM 135 at the beginning and the end of a simulation, to configure the SCM 135 and then to reclaim the SCM 135 once the simulations is over. Additionally, the host workstation 105 interacts with the SCM 135 in limited instances while the simulation is running, when the DUT 130 is interacting with a C-model 125 enabled by the DUT 130.

The primary interactions between the SCM 135 and the DUT 130 are through design clocks generated by the SCM 135 and through control signals sent from the SCM 135 to the DUT 130. These control signals include signals to start or stop the various state devices in the DUT 130, or to place these state devices into a re-circulating mode, to effectively save the state of the DUT 130 when simulation is stopped by the user or by the SCM 135. The SCM 135 also detects abort conditions generated by the DUT 130 and transfers this information to the host workstation 105. The SCM 135 also generates a simulation clock signal, which is the master timing signal used to mark elapsed time in the DUT 130 and to regulate the simulation in the DUT 130. The host workstation 105 interacts with the SCM 135 by examining and depositing to various registers created within the circuitry of the SCM 135.

The SCM 135 implements an algorithm that allows for efficient generation of clock edges for multiple asynchronous clock domains. This algorithm can be repeatedly applied to generate many edges successively without external interaction. Therefore the DUT 130 can be simulated for a substantial period of time without any intervention from the host workstation 105, which results in a substantial increase in the overall speed of the simulation. The SCM 135 also monitors the DUT 130 for any abort conditions generated by the DUT 130, such as C-model enable signals. When the DUT 130 generates an abort condition, the SCM 135 halts the simulation of the DUT 130. If the abort condition is a C-model enable, the SCM 135 interacts with the host workstation 105 to properly simulate the C-model function. If the abort condition is generated for some other reason, the SCM 135 interfaces with the host workstation 105 to take the proper action in response to the abort condition.

The SCM 135 of an embodiment is capable of generating both oversampled and direct-mapped design clock signals, and can generate clock signals for multiple asynchronous clocks with non-uniform duty cycles. "Oversampling" is a technique used to achieve a single correct phase of a design clock using multiple clock cycles of the underlying simulation clock. This allows, for example, designs with latches and complex memory models to run correctly on a simulation platform that supports only single-edge flops. For example, if a design clock has a cycle time of four time units (i.e. repeats every four time units—phases low for two time units, then phases high for two time units, etc . . . ) and a simulation clock has a cycle time of one time unit (i.e. repeats every time unit-phases low for ½ time unit, then phases high for ½ time unit, etc . . . ) then since the design clock is sampled once for every cycle of the simulation clock, the design clock is sampled twice per design clock phase, and is said to have an oversample rate of 2. Oversample rates are typically measured in cycles per phase, or cpp. Direct-mapped clock signals are signals with a cpp=1. A clock with a non-uniform duty cycle is a clock where the length of the low phase and the length of the high phase are not the same. For example, a non-uniform duty cycle clock may have a low phase of 3 time units duration, and a high phase of 2 time units duration. The SCM 135 optimizes the clock generation function by omitting any cycles in which no design clock transitions occur.

The SCM 135 can also be bypassed entirely, allowing the software clock facility 120 in the host workstation 105 to control the DUT 130 itself. For example, in situations where the overhead of creating and initializing the SCM 135 is greater than the time savings that will be realized by using the SCM 135, the SCM 135 can be bypassed. This often happens in situations where the DUT 130 is simulated for short periods of time only. The SCM 135 is designed in conjunction with the software clock facility 120, to make it easy to switch between using the software clock generators in the software clock facility 120 and the hardware clock generators in the SCM 135. This allows the host workstation 105 to choose whichever method is most efficient at that exact moment, without restrictions or risk of the software and hardware clocks becoming unsynchronized.

When using the software clock generators, the SCM 135 is disabled. This is known as "SCM bypass mode". Some designs are built onto the hardware acceleration box 110 without the SCM 135 being built at all, and are run only in SCM bypass mode. These designs are typically used with a latch-based software engine, although use with any other engine running an oversampled design is also possible. The SCM 135 and the SCM bypass mode are designed to operate in a congruent manner for any given hardware accelerator box 110. Some modes may be more appropriate for one particular type of hardware accelerator box 110, but both modes work the same way and produce the same results regardless of the hardware accelerator box 110 they are used on.

As noted above, the SCM layer 123 is resident on the host workstation 105, and interfaces with the SCM 135. The SCM layer 123 uses some data types exported by the software clock facility 120, and it augments these data types with some data types of its own. The SCM layer 123 centers around an SCM manager (of type tSCMmanager), as shown in Table 1 below:

TABLE 1

| PUBLIC | typedef struct tSCMmanager_ tSCMmanager;<br>typedef void (*tUIcallbackFn) (void* pUserData);<br>typedef enum {<br>SCM_BYPASS, SCM_ENABLE, SCM_AUTO_DETECT<br>} tSCMbypassAction; |
|---|---|
| PRIVATE | struct tSCMmanager_<br>{<br>. . .<br>}; |

Before any SCM operations are performed, the SCM manager is created with a call to SCMcreatemanager( ), shown in Table 2 below. The SCM manager created defaults to a 2× oversample rate (i.e. cpp=2).

TABLE 2

Create an instance of an SCM manager.
The manager created uses the specified clock manager to perform iteration.

| PUBLIC | tSCMmanager*<br>SCMcreateManager(tClockManager* pClockManager);<br>create an SCM manager to layer over the given clock manager |
|---|---|

The SCM layer 123 presents an interface to higher layers within the host workstation 105 that allows them to request iteration of the simulation over multiple design clock edges, without interaction with the host workstation 105, while freeing those higher layers from the need to understand the details of oversampling. Oversampling details are hidden below the SCM interface, and control of interaction is handled above the SCM layer 123.

The SCMsetCyclesPerPhase( ) function is used to set the oversample rate for the SCM layer 123. This function returns an error condition if called for direct-mapped designs, since direct-mapped designs do not use oversampling. The function call for the SCMsetCyclesPerPhase( ) function is shown in Table 3 below.

TABLE 3

|  |  |
|---|---|
|  | Sets the oversample rate for the clock manager. "cpp" must be between 1 and 255, inclusive. Calling this function for direct-mapped designs is an error. Returns 0 on success and non-zero on error. |
| PUBLIC | int SCMsetCyclesPerPhase(tSCMmanager* pSCMmanager, unsigned int cpp); set the oversample rate to cpp |

To step a certain number of design clock edges, the SCM layer 123 provides the SCMstepEdges( ) function, see Table 4 below. An optional callback function can be supplied, called "pHiResFn". When present, the callback will be called after each oversample cycle. Simulation engines, such as the hardware accelerator box 110, with a free-running simulation clock may not be able to support a callback at each oversample cycle, since it may not be practical to stop the simulation clock on every oversample cycle. On some simulation engines, it is not practical to stop the simulation clock at all. Instead, the SCM 135 will halt the simulation of the DUT 130 by placing all of the state devices of the DUT 130 into a recirculation mode, thereby retaining the state of the DUT 130 and effectively stopping the simulation of the DUT 130. The SCM 135 will also prevent the clock generators 210 from generating new design clock edges. In this case, the callback function will be executed as often as possible, which may be more or less often than once per oversample cycle. On other simulation engines where it is practical to stop the simulation clock on demand, the above process is avoided.

TABLE 4

|  |  |
|---|---|
|  | Step a number of edges in a specified domain. If the pHiResFn is non-NULL, it will be called after every oversample cycle with the pUserData argument. The "edgeMask" is a mask of edges to be counted, or ANY_DOMAIN. If ANY_DOMAIN is specified, then edges of all domains are counted. Edges which occur simultaneously are counted as a single edge. An edge mask of 0 is invalid. The number of edges actually advanced is written into the memory pointed to by "pElapsedEdges". Returns 0 (FALSE) when returning normally. Returns 1 (TRUE) when returning after an abort occurred. |
| PUBLIC | int SCMstepEdges( tSCMmanager* pSCMmanager, tUint64* pElapsedEdges, tEdgeMask edgeMask, tUint64 numEdges, tUIcallbackFn pHiResFn, void* pUserData); step the requested number of edges in the given clock domains. call the pHiResFn callback, if present, after every oversample cycle. |

The SCM layer 123 also allows time to be advanced by individual time units, using the SCMstepTimeUnit( ) function, Table 5 below.

TABLE 5

|  |  |
|---|---|
|  | Advance time by a given amount. If the pHiResFn is non-NULL, it will be called after every oversample cycle with the pUserData argument. The amount of time actually advanced is written into the memory pointed to by "pElapsedTime". Returns 0 (FALSE) when returning normally. Returns 1 (TRUE) when returning after an abort occurred. |
| PUBLIC | int SCMstepTimeUnits( tSCMmanager* pSCMmanager, tUint64* pElapsedTime, tUint64 duration, tUIcallbackFn pHiResFn, void* pUserData); step the requested number of time units call the pHiResfn callback after every oversample cycle, if present |

The two functions to advance time by edges and time units may not be able to fulfill the entire simulation request interval made by the host workstation 105, because of a C-model enable or other abort condition which prevents the DUT 130 from completing the simulation. Each function returns a non-zero value when an abort is detected, and fills in the user-supplied 64-bit value with the amount of the simulation request which was fulfilled prior to the abort being detected. The caller must handle the abort condition even if the advancing functions claim to have fulfilled the entire simulation request, because the abort may have occurred during the final phase of the requested simulation interval, while there were still remaining oversample cycles of the final phase that had gone unprocessed.

The SCM layer 123 also provides routines to control how and when the SCM 135 is bypassed. The SCMsetBypassMode( ) function, of Table 6 below, takes a tSCMbypassAction argument, which can be either SCM_BYPASS, SCM_ENABLE, or SCM_AUTO_DETECT. SCM_BYPASS always attempts to bypass the SCM 135, SCM_ENABLE never attempts to bypass the SCM 135, and SCM_AUTO_DETECT allows the SCM layer 123 to bypass the SCM 135 whenever the SCM layer 123 determines that it is most efficient to do so. SCM_AUTO_DETECT is the default behavior. Requests to bypass the SCM 135 may sometimes be ignored, because on some simulators 100, or under some operating conditions, the SCM 135 cannot be bypassed.

TABLE 6

|  |  |
|---|---|
|  | Allows the user to control how and when the SCM is bypassed. An action of SCM_BYPASS requests to always bypass the SCM, SCM_ENABLE requests to never bypass the SCM, and SCM_AUTO_DETECT allows the SCM layer to choose when to bypass and when not to bypass. Any other value is invalid. SCM_AUTO_DETECT is the default. |
| PUBLIC | void SCMsetBypassMode(tSCMmanager* pSCMmanager, tSCMbypassAction action); set the bypass preference based on the given action |

After all SCM operations are complete, the SCM manager can be reclaimed by calling the SCMreleaseManager( ) function, shown in Table 7 below.

TABLE 7

Release the resources used by an instance of an SCM manager created by the SCMcreateManager( ) function.

Figure 2A:
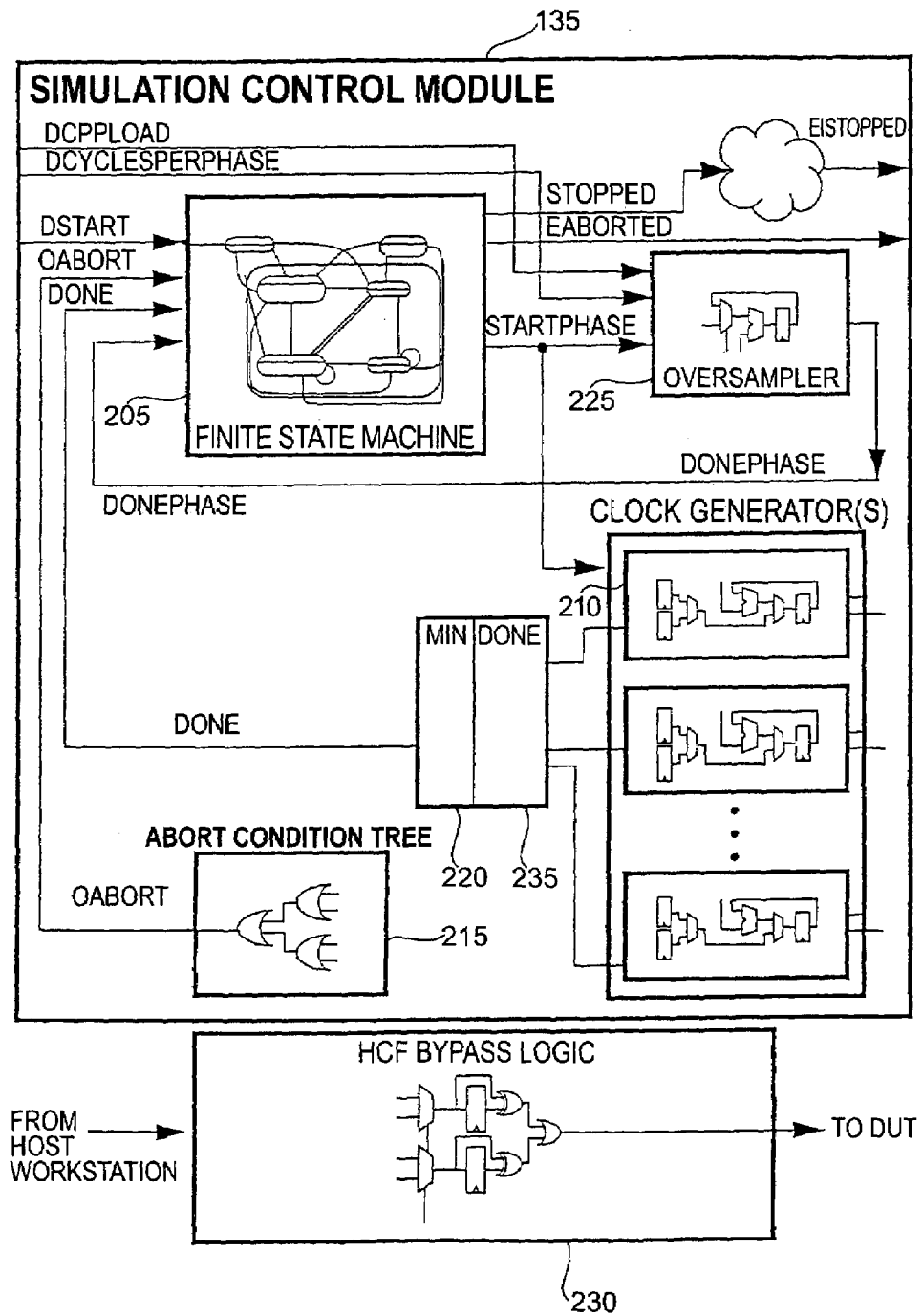
FIG. 2 shows a simulation control module according to an embodiment of the invention.
Figure 2B:
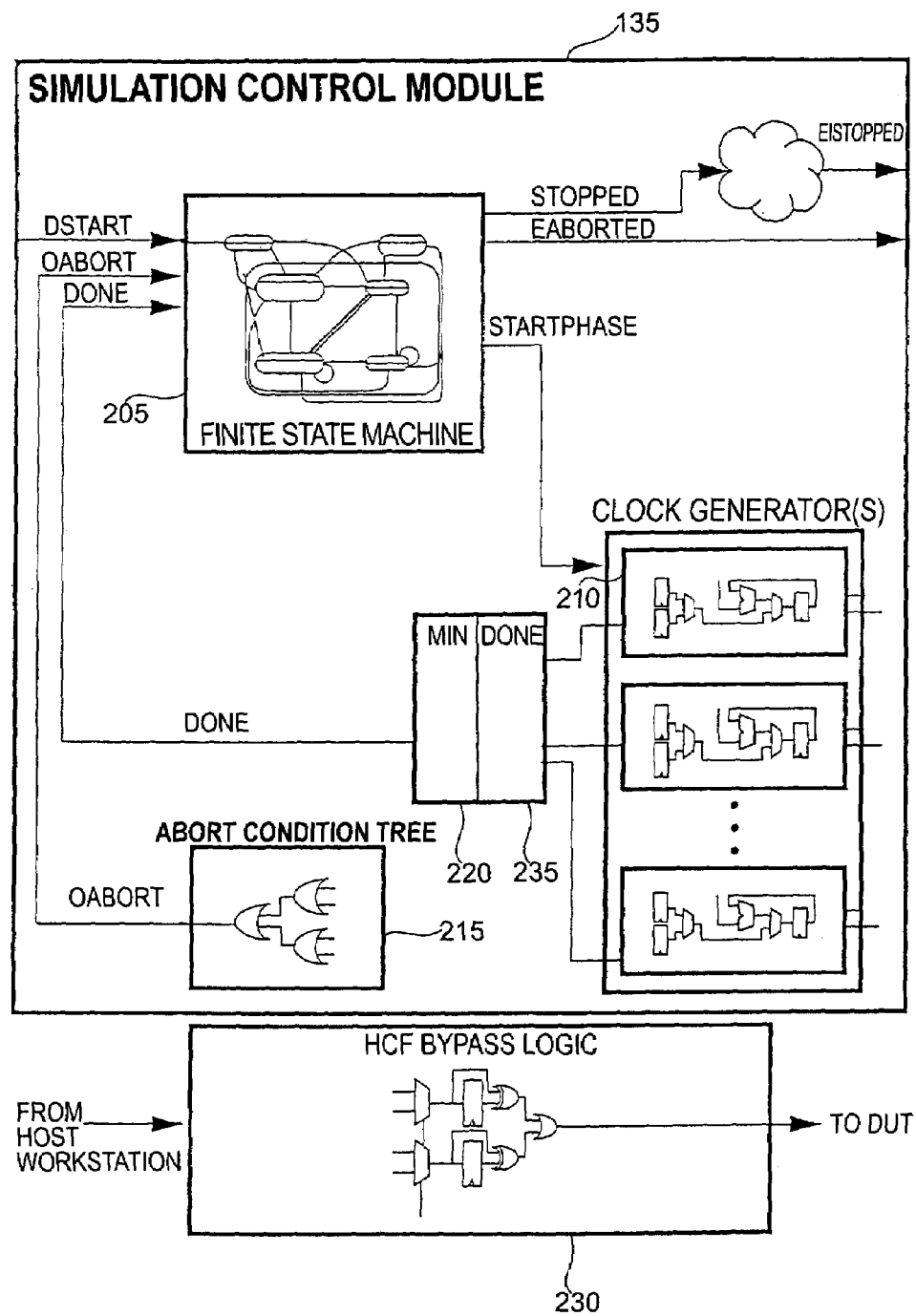

PUBLIC void SCMreleaseManager(tSCMmanager* pSCMmanager);
release all resources used by the scm manager The SCM 135 is instrumentation and control logic which is added alongside the DUT 130 during the process of building the circuitry in the hardware accelerator box 110. The SCM 135 is constructed "on-the-fly", to match the needs of the DUT 135. Turning to FIG. 2A, an SCM 135 configured to support oversampled designs includes a finite state machine 205, a design clock generation circuit 210 for each design clock used to simulate the DUT 130, an abort condition tree 215, a min circuit 220, a done circuit 235, and an oversampler circuit 225. Bypass logic 230 is associated with the SCM 135, to allow the SCM 135 to be bypassed in certain situations. Turning to FIG. 2B, an alternate embodiment of the SCM 135 is shown, configured to support direct-mapped designs. Since the SCM 135 in direct-mapped mode does not support oversampling, the oversampler 225 and associated connections are not present in this alternate embodiment. The signals shown in FIG. 2A and 2B are discussed in Table 8 below. The SCM layer 123 interacts with the SCM 135 by examining signals in and depositing signals to registers within the SCM 135. The contents of these registers are not normally visible to the user, but can be accessed for debugging purposes if necessary.

depositing the signal from the host workstation 105 (denoted by 'D'), examining the signal by the host workstation 105 (denoted by 'E'), using the signal as an input to the DUT 130 (denoted by 'I') and connecting the signal to an output of the DUT 130 (denoted by 'O'). Each SCM signal prefix is a concatenation of the applicable single letters. For example, the prefix "EI" signifies that the signal is SCM output which can be examined by the host workstation 105 and used as an input to the DUT 130. In practice, only seven of the possible prefix combinations are used: D, E, DE, EI, EO, O, and I. Other embodiments are possible which use other combinations of these prefixes. Internal SCM signals (signals that are not SCM outputs) are prefixed with the letters "SCM". Some of the internal SCM signals are replicated for each design clock. For the example embodiment having 16 design clocks, these signals end with a number from 1 to 16, indicating which design clock they refer to. An "*" is used herein to represent the set of all signals across all design clocks, and the letter "N" replacing the number is used to represent a single signal from an unspecified design clock.

The SCM 135 is controlled by the host workstation 105 and in turn controls the DUT 130. Similarly, the SCM 135 monitors the DUT 130 and reports status back to the host workstation 105. These interactions occur through special SCM signals, through a specialized protocol of depositing and examining signal values into registers within the SCM 135 and elsewhere. The SCM layer 123 hides all of these details from the higher layers of the host workstation 105. Table 8 below indicates the SCM signals used in an embodiment.

TABLE 8

| Signal | Workstation interaction | DUT interaction | Purpose |
|---|---|---|---|
| Dstart | deposit | | a rising edge initiates SCM running |
| DuserAbort | deposit | | aborts current SCM run |
| Dbypass | deposit | | gives host workstation control over SCM outputs |
| DEcountTime | deposit/examine | | indicates whether DEinterval is in time units or edge counts |
| DEinterval | deposit/examine | | holds time/phases requested but not yet complete |
| DEedgeMask | deposit/examine | | holds edge mask which determines which edges are counted in the iteration interval |
| DEbaseTime | deposit/examine | | holds total elapsed time count |
| DEbaseEdges | deposit/examine | | holds total elapsed edge count |
| DEbaseEdges* | deposit/examine | | holds per-clock elapsed edge count |
| DcyclesPerPhase | deposit | | holds oversampling rate, for oversampler |
| DuserClk* | deposit | | per-clock clock inputs for bypass mode |
| DEclk* | deposit/examine | | per-clock clock value |
| DEnextEdge* | deposit/examine | | per-clock "next edge time" |
| DEvalue0Len* | deposit/examine | | per-clock "0 phase length" |
| DEvalue1Len* | deposit/examine | | per-clock "1 phase length" |
| Eaborted | examine | | SCM output for abort condition |
| EIstopped | examine | input | output tells DUT when the SCM is running and tells workstation when the SCM run is complete |
| clk* | examine | input | outputs of clock generators drive the DUT |
| InewPhase | | input | output tells DUT where the clock phase boundaries are (used to implement boundary ops and change ops) |
| C-model enables | examine | output | used to generate Oabort SCM input |

For convenience of description, the SCM signals described herein follow certain naming conventions. Each signal name begins with a prefix that encodes what actions can be performed on that signal. Possible actions are:

Dstart, DuserAbort, Dbypass, DEcountTime, DEinterval, DEbaseTime, DEbaseEdges, DEbaseEdges*, DcyclesPerPhase, DuserClk*, DEclk*, DEnextEdge*, DEvalue0Len* and DEvalue1Len* are all inputs to the SCM 135 which can be deposited to by the host workstation 105. The host workstation 105 can examine the values of EIstopped, Eaborted, DEcountTime, DEinterval, DEbaseTime, DEbaseEdges, DEbaseEdges*, DEnextEdge* and DEclk* to probe the state of the SCM 135. The DUT 130 also uses the EIstopped signal from the SCM 135, as well as InewPhase and the clocks from the clock generators 210. All of the C model enable signals from the DUT 130 are OR'ed together along with the DuserAbort signal to create the Oabort input to the SCM 135.

The SCM 135 uses approximately 2500 gates and 200 state devices to create the first design clock generator in the SCM 135. Additional design clock generators use approximately 1300 gates and 100 state devices. The number of gates and state devices used varies depending on how large a datapath width is required. The datapath width needs to be wide enough to represent the largest supported design clock phase length possible, as well as the largest number of simulation cycles possible. These numbers can be reduced by decreasing the datapath widths within the design clock generators, provided that a suitable upper bound can be placed on the clock phase lengths and/or maximum requested simulation time supported by the SCM 135. The longest path in the SCM 135 of this embodiment goes from the two registers which store the length of the phases of each design clock (DEvalue0Len* and DEvalue1Len*), through a multiplexer, a 5-level OR tree, two more multiplexers, a set of 32-bit comparators and multiplexers, a 32-bit full adder, an AND gate, another multiplexer, a 64/32-bit subtractor, through a 3-level OR tree, and into the SCMdone input of the state machine. Using efficient implementations of the arithmetic circuits can bring this path to around 100 2-input gates. Other embodiments will have different longest paths.

The hardware of the SCM 135 is split into five components. The core of the SCM 135 is a finite state machine (FSM) 205, which implements the fundamental behavior of the SCM 135: starting design clocks, counting design clock cycles, and monitoring the abort conditions generated by the DUT 130. The finite state machine 205 counts cycles by interfacing to the design clock generation circuits 210, through auxiliary "min" circuit 220 and "done" circuit 235. There is one design clock generation circuit 210 for each user-defined design clock in the DUT 130. The actual design clock signals which drive the DUT 130 come from the design clock generation circuits 210. The design clocks are coordinated using a "min" circuit 220 which determines the minimum time to the next edge of any design clock, and a related "done" circuit 235 which determines when the requested SCM simulation run is complete. An oversampler circuit 225 controls all oversampling, determining how many simulation cycles should go into each design clock phase. An abort condition tree 215, comprising an OR tree, is used to combine all of the different abort conditions in the DUT 130 into a global abort input for the SCM 135. Additional bypass logic 230 is synthesized to allow the SCM layer 123 to bypass the SCM 135 entirely in some cases. The alternate embodiment of FIG. 2B does not include the oversampler 225, since the alternate embodiment is designed to support direct-mapped mode, where an oversampler 225 is not necessary.

Figure 3A:
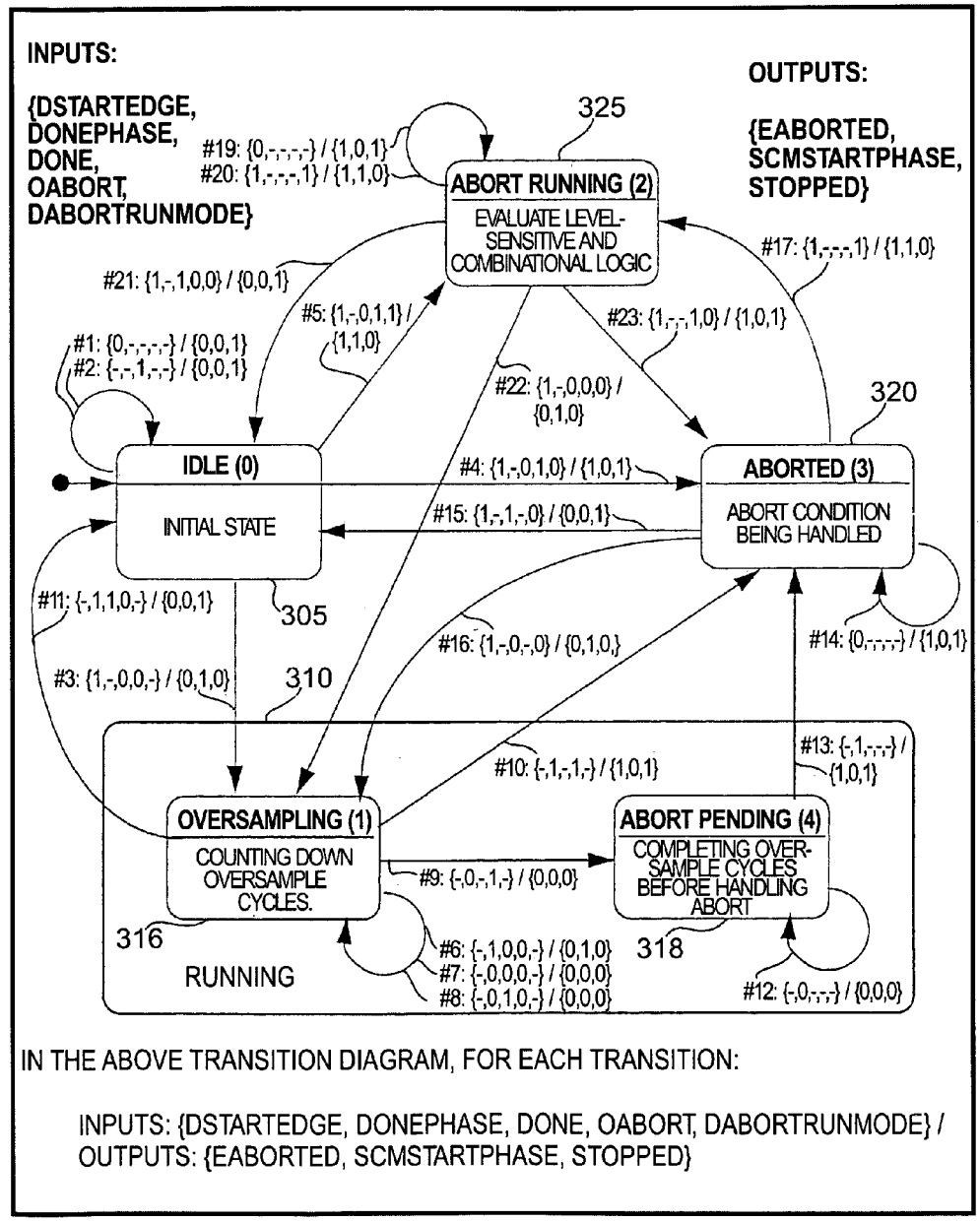
FIG. 3 shows a finite state machine according to an embodiment of the invention.

Turning to FIG. 3A, while the SCM 135 configured in oversampling mode is in operation, the finite state machine 205 is one of four main states, either the idle state 305, running state 310, aborted state 320, or abort running state 325. The finite state machine 205 receives five input values {DstartEdge, donePhase, done, Oabort, and DabortRunMode}, and generates three output values {Eaborted, InewPhase, stopped}. Each input and output value can be high (1) or low (0). The various states of the FSM 205 are connected to each other by transitions, shown by the arrows between the states. Each transition includes a list of input values which trigger the transition, and a list of output values generated when the transition occurs.

Figure 3B:
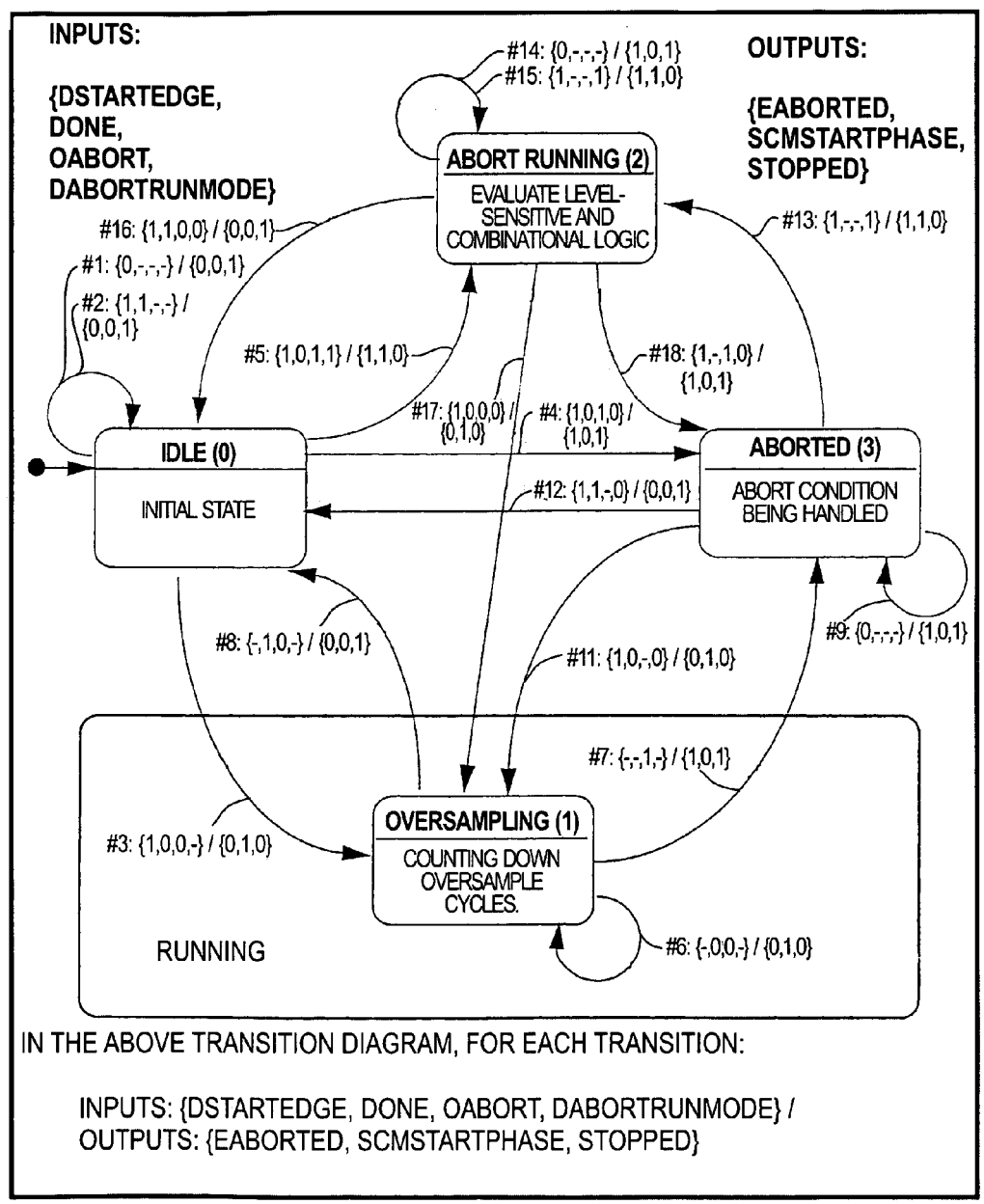

FIG. 3B depicts an alternate embodiment of the SCM 135 configured for direct-mapped mode, where the design clock phases are mapped directly to simulation clock cycles. The states and transitions of this alternate SCM 135 are similar to the oversampled mode SCM 135, except for the abort pending state 318, which is unnecessary in the direct mapped mode, since in direct-mapped mode an abort cannot be triggered in the middle of a set of oversample cycles.

The Dstart signal is a signal from the host workstation 105 signaling that the SCM 135 is running. A rising edge on the Dstart signal (DstartEdge=1) allows the SCM 135 to move out from the idle state 305 or the aborted state 320. The donePhase signal is an output from the oversampler 225. This signal indicates that for the current design clock phase, the oversampling cycles specified via the DcyclesPerPhase input to the SCM 135 have been completed. If additional design cycles are pending, it causes the SCM 135 to stay in the running state 310, otherwise if the requested design cycles have all been completed, it causes the SCM 135 to move to the idle state 305. The done signal is an output from the done circuit 235. This signal indicates that the current requested simulation run has been completed. On the rising edge of Dstart, the done signal causes the SCM 135 to transition to the idle state 305. The Oabort signal is an output from the abort condition tree 215. This signal indicates that an abort condition has been triggered in the DUT 130, which needs to be handled by the SCM 135. This signal causes the SCM 135 to move to the aborted state 320. The DabortRunMode signal is a signal from the host workstation 105 signaling that the SCM 135 has been aborted, but is being run to provide data or otherwise service a request from the host workstation 105, such as a request from a C-model on the host workstation 105.

For the outputs, the Eaborted signal is output whenever the operation of the DUT 130 has been aborted. The SCMstartPhase signal is output whenever a new design clock phase is initiated, triggering a new set of oversample cycles. The stopped signal is output whenever the simulation of the DUT 130 has been halted, either in the idle or the abort states.

At each cycle of the simulation clock, the SCM 135 can transition from one state to another. For example, from the idle state 305, a rising edge (shift from a low clock signal to a high clock signal) in the Dstart signal from the SCM layer 123, combined with a false (i.e. 0, logic low, etc.) value from the done signal and a false from the Oabort signal causes a transition to the running state 310 as indicated by the transition #3, having inputs {1,–,0,0,–}. This transition also has an output of {0,1,0}, indicating that the SCM 135 has not been aborted, has started a new design clock phase, and has not been stopped, respectively. A rising or falling edge in the Dstart signal combined with a true value (i.e. 1, logic high, etc.) from the done signal, however, causes the idle state 305 to transition back to itself, as shown by the transition #2, having inputs {–,–,1,–,–}. The other various transitions between the states of FIG. 3A occur when the indicated signals for each transition assume the indicated values, where a "1" indicates a high value, a "0" indicates a low value and a "–" indicates either a high or a low value. The complete listing of transitions in the SCM 135 of FIG.

3A is listed in FIG. 15. The complete listing of transitions in the SCM 135 of FIG. 3B is listed in FIG. 16.

The idle state 305 is the initial state of the finite state machine 205, and is the state to which the FSM 205 returns after completing a normal simulation run. When a run is aborted, the FSM 205 will transition to and remain in the aborted state 320. When returning from the aborted state 320, if the SCM 135 is operating in certain modes useful to support co-simulation, the FSM 205 will transition to the abort running state 325.

In the abort running state 325, the hardware accelerator box 110 will run portions of the DUT 130, such as level-sensitive blocks and combinational logic, without advancing time. This allows the software portion of the co-simulation to obtain needed data without distorting the simulation by erroneously advancing time on the hardware accelerator box 110. Subsequent to the abort running state 325, the FSM 205 transitions to the idle state 305 if the simulation run is complete, or else to the running state 310 if the simulation run is not complete.

While the SCM 135 is running in oversampling mode, the FSM 205 will be in the running state 310, which incorporates two sub-states; the oversampling state 316 and the abort pending state 318. The FSM 205 enters the running state through the oversampling state 316. The oversample cycles are counted down through iterations in the oversampling state 316. When all oversample cycles for the current design clock phase have been run, the FSM 205 transitions back into the oversampling state 316 and initiates another design clock phase. When an abort condition occurs, the FSM 205 will either transition to the abort pending state 318 to count down the remaining oversample cycles in the current design clock phase and then on to the aborted state 320, or will transition directly to the aborted state 320 if the abort condition occurs on the last oversample cycle of a design clock phase. In direct-mapped mode, the SCM 135 will transition directly to the aborted state 320 when an abort condition occurs, since an abort condition cannot occur in the middle of a set of oversampling cycles in direct-mapped mode.

Figure 4:
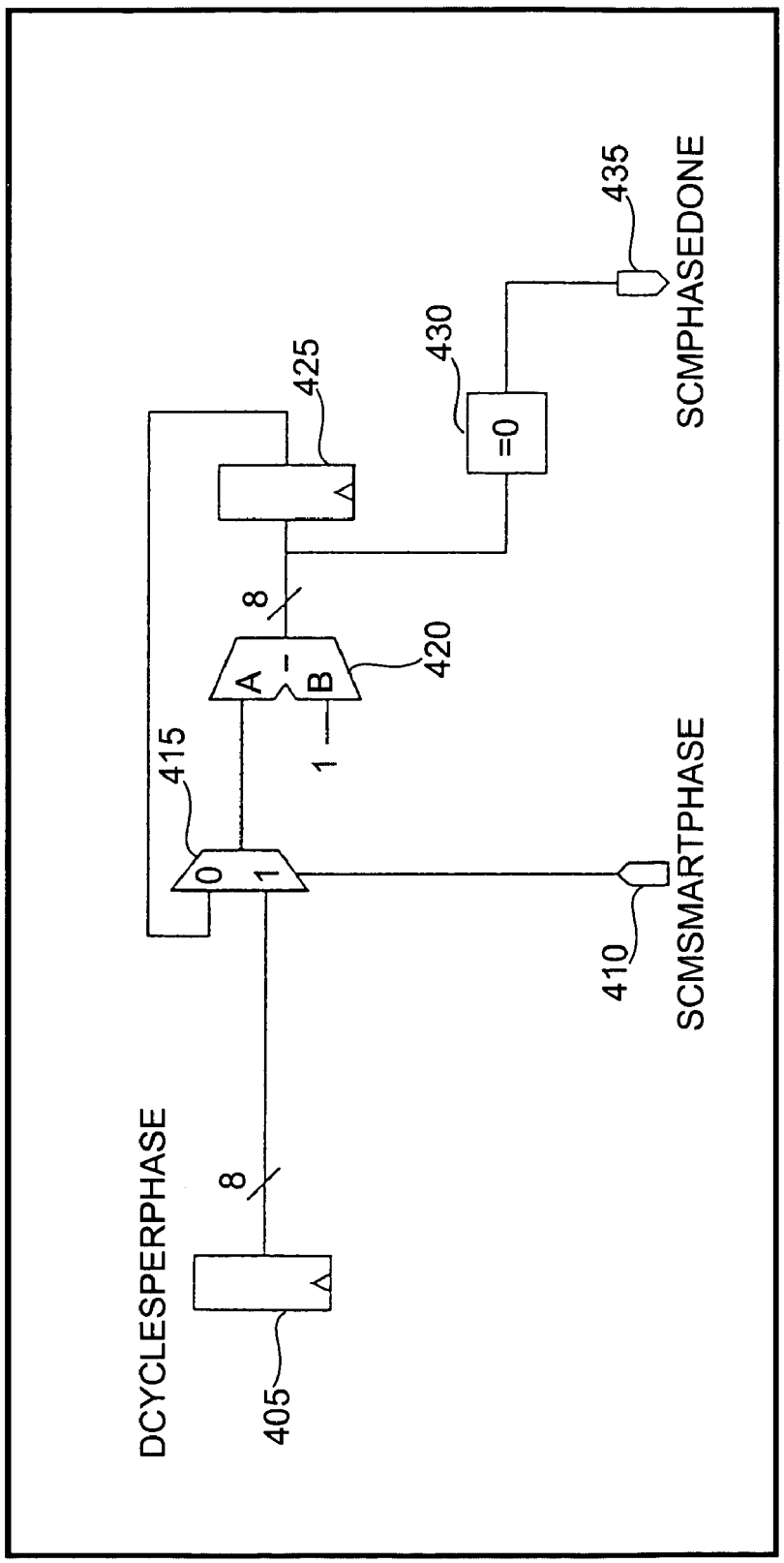
FIG. 4 shows an oversampler circuit according to an embodiment of the invention.

Oversampling in the SCM 135 is controlled by the oversampler circuit 225, shown in detail in FIG. 4. The oversampler circuit 225 has an SCMdonePhase input 410 from the FSM 205. In an embodiment, the oversampler circuit 225 includes a oversample register 405 containing the desired oversample rate (DcyclesPerPhase), and a down counter comprising a multiplexer 415, a subtractor 420 and a register 425. When SCMstartPhase goes high, the multiplexer 415 selects the oversample register contents to pass to the subtractor 420. The subtractor 420 subtracts one from the contents, and loads them into the counter register 425. Thus when the clock phase is started, the counter is loaded with the oversample rate minus one. When SCMstartPhase is low, then the contents of the counter register 425 are selected by the multiplexer 415, one is subtracted from these contents by the subtractor 420, and the new value is re-loaded back into the counter register 425, thus decrementing the oversample rate. Once the oversample rate is decremented to zero, then the comparator 430 sends a high signal to the SCMdonePhase output 435, which triggers a transition out of the oversampling state 316. In alternate embodiments, more advanced oversampler circuits are substituted in, which for example use different oversample rates for different design clock conditions, use additional cycles when a C-model is invoked, or monitor asynchronous loop settle conditions. An asynchronous loop in a digital circuit is a path through a circuit where there does not exist a state device, such as a latch or a flop, in this case, the circuit may never settle to a steady state, this case is usually called a "ringing" circuit. For example if you connected the output of a NOT gate to its own input you have a circuit which will never settle, if the input is a zero the output will change to a one. Since the output is connected to the input, the input will change to a one which will cause the output to change to a zero and so on. The circuit can never settle in one particular state. It is possible to build a circuit with no state devices that will settle to a steady state given some set of inputs. The number of times the circuit must be simulated to get to a steady state may be greater than one. In this case it is advantageous to monitor the asynchronous portion of the circuit to see if it settles; i.e. none of the internal signals within the asynchronous path have changed state during simulation of the circuit. If any of the signals change state, then the asynchronous loop has not settled and is simulated again.

Figure 5:
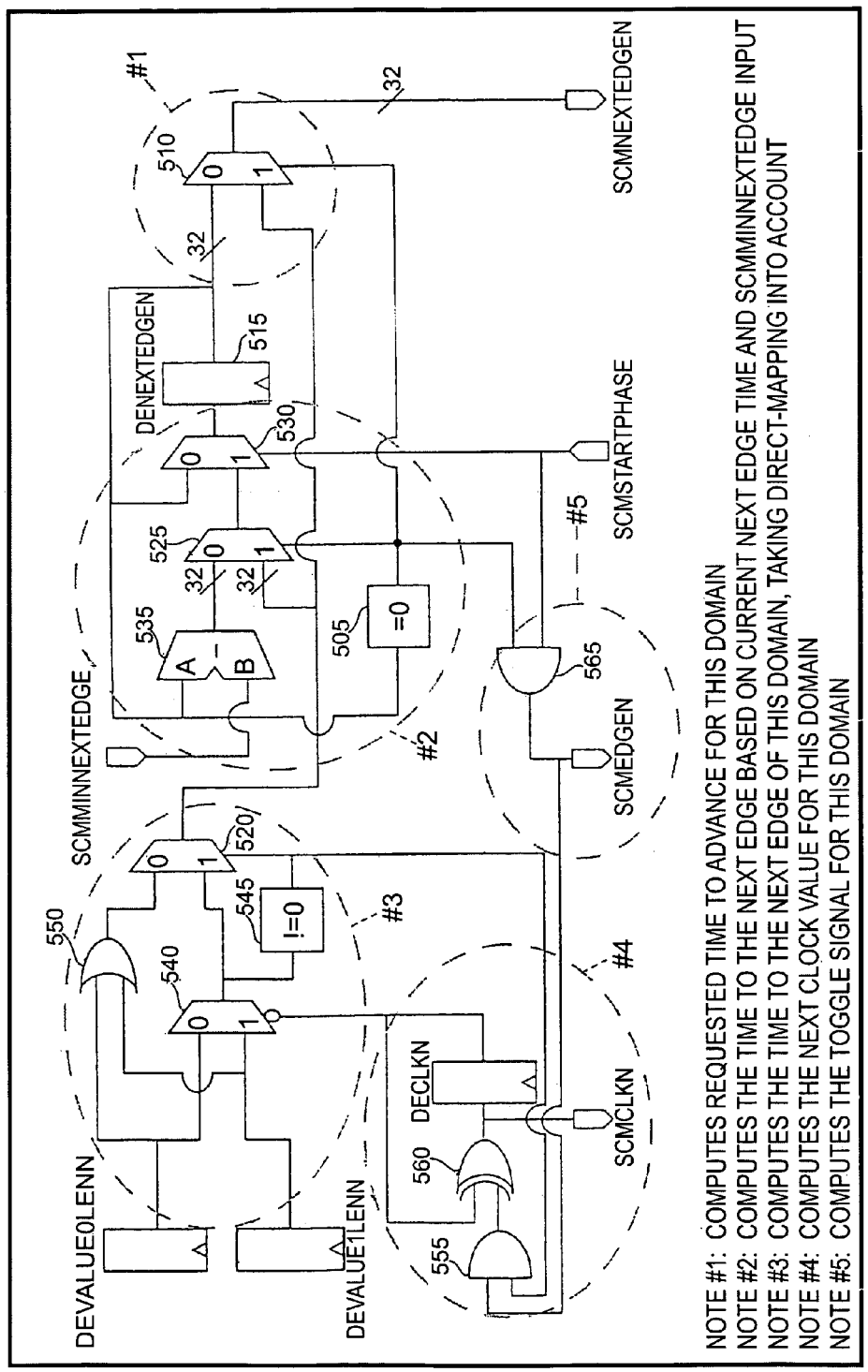
FIG. 5 shows a clock generator according to an embodiment of the invention.

Turning to FIG. 5, the design clock generators 210 are each a hardware implementation of a multiple clock domain (MCD) generation algorithm. This algorithm is described in detail below. The design clock generators 210 embody methods for determining if any design clock edges remain to be simulated in the simulation run, and methods for determining what set of design clock transitions should make up the next design clock phase. The hardware implementation of the design clock generators 210 shares the same state as the software implementation of the software clock facility 120 of FIG. 1, so that the two clock generators can be easily synchronized. For each design clock, the SCM 135 stores: the length of the low phase (DEvalue0LenN), the length of the high phase (DEvalue1LenN), the time until the next edge (DEnextEdgeN), and the current clock value, high or low (DEclkN). In addition, the SCM 135 contains a register, DEInterval, with the total amount of time (or clock edges) to be simulated in the simulation run, as well as counters DEbaseTime, DEbaseEdges, and DEbaseEdges* which accumulate elapsed time and edge counts for both the simulation clock and the design clocks.

The clock generators 210 perform five basic functions, as enumerated in FIG. 5. The first basic function generates as an output SCMnextEdgeN, which is the request from the Nth clock generator 210 to advance time by a given amount. If DEnextEdgeN is non-zero, then the comparator 505 causes the multiplexer 510 to select the zero input, from the register 515, to pass on to the output SCMnextEdgeN, thereby causing SCMnextEdgeN to be set to DEnextEdgeN. Otherwise, the comparator 505 causes the multiplexer 510 to select the one input, from the multiplexer 520, thereby causing SCMnextEdgeN to be set to the phase length of the upcoming design clock phase, either high or low as determined by the position of the multiplexer 520. Thus, SCMnextEdgeN communicates the time until the next future edge of this design clock to the SCM 135. Edges that occur at the current time (DENextEdgeN=0) are not counted. The SCM 135 uses this information, gathered from all the design clocks in the SCM 135, to determine how far to advance the simulation clock in order to simulate the next design clock edge from amongst all the design clocks.

The second basic function generates as an output DEnextEdgeN, which is stored in the register 515. DEnextEdgeN represents the time to the next edge for the Nth design clock, including edges which occur at the current time. If the SCMstartPhase value is high, indicating the start of a design clock phase, then the DEnextEdgeN register 515 is loaded with the output of the multiplexer 525. If DEnextEdgeN=0, then the comparator 505 returns a high value, which causes the multiplexer 525 to select the next phase length value from the multiplexer 520 and pass it on to the multiplexer 530. Otherwise, the multiplexer 525 selects the value from the subtractor 535, which is DEnextEdgeN−SCMminNextEdge (the minimum of all the SCMnextEdge* signals). This ensures that all design clock generators 210 advance together by the smallest increment requested by any one of them. If the SCMstartPhase value is low, indicating that a design clock phase is being processed, then DEnextEdgeN is simply cycled back into the register 515 via the multiplexer 530.

The third basic function generates as an output the next design clock phase length. The next design clock phase length is selected from either DEvalue0LenN or DEvalue1LenN, depending on the clock value of the next phase (which is the opposite of the current clock value DEclk). Thus, if DEclkN is 0, then the multiplexer 540 select input is inverted to a 1, causing the multiplexer 540 to select the DEvalue1LenN value to pass on to the multiplexer 520. If DEcLkN is 1, then the multiplexer 540 select input is inverted to a 0, causing the multiplexer 540 to select the DEvalue0LenN value to pass on to the multiplexer 520. If the selected value, either DEvalue0LenN or DEvalue1LenN is not zero, then the comparator 545 passes a high value to the multiplexer 520, causing the multiplexer 520 to select the selected value. If the selected value is zero, meaning that the next phase length is 0, then the SCM 135 is in direct-mapped mode, so the selected edge is ignored, and the opposite edge is instead selected. If the selected value is zero, the comparator 545 passes a low value to the multiplexer 520, causing the multiplexer 520 to select the OR of the two length values DEvalue0LenN and DEvalue1LenN, from the Or-gate 550. Since one of these values is zero (the selected value), OR'ing it with the other value causes the other value to be selected by the multiplexer 520 as the next design clock phase length.

The fourth basic function generates SCMclkN, which is the new clock value (either high or low). When the toggle signal SCMedgeN goes high, and the SCM 135 is not in direct-mapped mode as signified by the phase lengths not being 0, then the AND gate 555 goes high. This causes the NOR gate 560 to output the inverse of the DEclkN register contents, which is the current clock value. This toggles the current clock value and propagates that value to the output SCNclkN. If the SCM 135 is in direct-mapped mode, then each simulation clock cycle is doing the work of an entire design clock cycle of work, which is equivalent to two design clock transitions, which is equivalent to zero design clock transitions for purposes of determining the new clock value, since the design clocks alternate between two states, high and low. That is, if the clock is high, and it transitions twice, it goes low and then high again, leaving the clock in the same state as before it transitioned.

The fifth basic function generates the toggle signal SCMedgeN for the design clock generator 210. This signal tells the design clock generator 210 that it is time to toggle the design clock to the other state. SCMedgeN is generated by the AND gate 565 going high, which occurs when SCMstartPhase=1 and DEnextEdgeN=0, or when the SCM 135 is at the start of an design clock phase and there is a design clock edge on the current simulation clock phase.

The SCM 135 first determines the time of the next design clock edge, then uses this information to compute the new design clock state and whether or not any design clock edges remain to be simulated. To compute the time of the next design clock edge, the SCM 135 computes the minimum time to the next design clock edge in any of the design clocks. This is done through the min circuit 220, which comprises a tree of N comparator circuits for a design with N design clocks. The min circuit 220 produces as output the smallest number from its inputs, which inputs are DEinterval when the SCM 135 is proceeding in time unit intervals (DEcountTime=1) and the SCMnextEdge* value from each clock generator. When the SCM 135 is proceeding in design clock edge intervals (DEcountTime=0), DEinterval does not affect the minimum value, since DEinterval contains a clock edge count instead of a time units count.

The done circuit 235 determines when the SCM 135 has fulfilled its simulation request. SCMdone is true when the DEinterval value reaches 0. When proceeding in design clock edge intervals (DEcountTime=0), DEinterval counts design clock edges remaining. When proceeding in time unit intervals, DEinterval counts time units remaining. When SCMdone is true, all edges in the requested time period have been simulated, so the FSM 205 will exit the running state 310 after completing the current set of oversample cycles.

As long as there is time left to be simulated, the SCM 135 will move to the next design clock edge (or the end of the requested simulation period if there are no edges left), set the design clocks accordingly and modify the FSM 205 state to account for the advance of time. Specifically, any design clock whose next edge time is zero has its value toggled to the other design clock value, high or low. Each design clock has its next edge time updated as well. If the design clock values toggled, then the next edge time is loaded from the phase length for the next phase. If the design clock values didn't toggle, then its next edge time loads its own phase length value minus the minimum time to the next edge, as computed by the min circuit 220.

Figure 6:
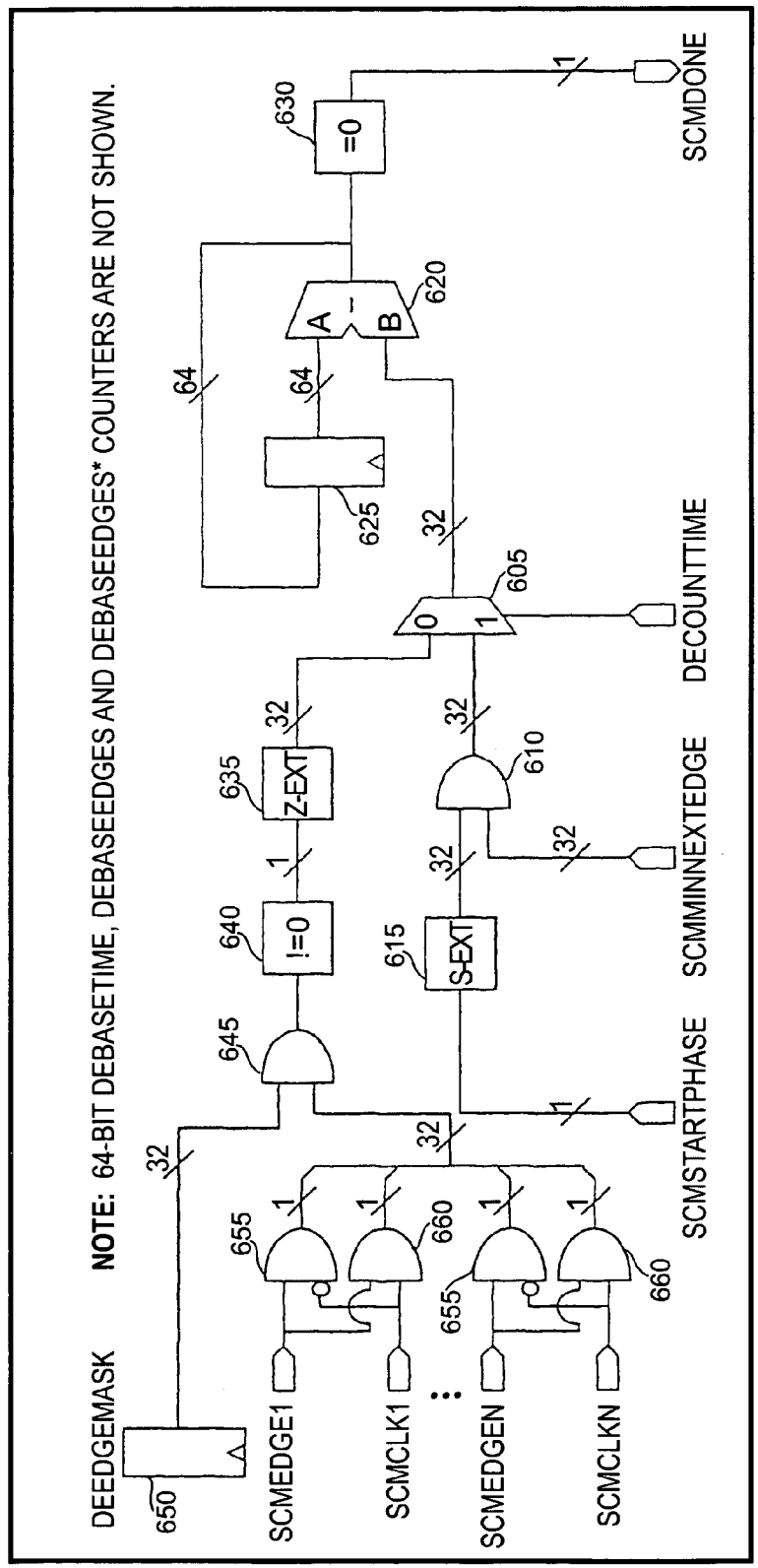
FIG. 6 shows a done circuit according to an embodiment of the invention.

Turning to FIG. 6, the done circuit 235 is responsible for tracking the progress of the SCM 135 towards fulfilling the user request for simulation time, as specified in DEinterval, DEcountTime, and DEedgeMask. When the SCM 135 iteration is specified in terms of time units (DEcountTime=1), the multiplexer 605 selects the output of the AND gate 610 to pass on to the subtractor 620. The AND gate 610 ands together the SCMminNextEdge value and the 32-bit sign-extended SCMstartPhase value created by the sign extender 615. Thus when SCMstartPhase is true, the SCMminNextEdge value is passed to the multiplexer 605; otherwise a zero value is passed. The subtractor 620 subtracts the value from the multiplexer 605 from the value DEinterval stored in the register 625, and passes this value both back to the register 625 and to the comparator 630. When the value passed to the comparator 630 becomes zero, the comparator passes a single-bit zero value to the output SCMdone. Therefore, DEinterval is decremented by SCMminNextEdge each design clock phase, and when DEinterval reaches zero, the done circuit 235 indicates that the user request for simulation time has been fulfilled.

When the SCM 135 iteration is specified on terms of edges (DEcountTime=0 and DEedgeMask contains an edge mask), then the multiplexer 605 selects the output of the sign extender 635 to pass on to the subtractor 620. The sign extender 635 extends the single bit result of the comparator 640 out to a 32-bit result used by the multiplexer. The comparator 640 goes high when the output of the AND gate 645 is a non-zero value, and goes low when the output of the AND gate 645 is all zeros.

The AND gate 645 ANDs together the 32-bit value DEedgeMask from the register 650, which is a user-defined mask value indicating which of the edges of each of the sixteen design clocks configured in the embodiment are to be counted in the simulation run, with a 32-bit value indicating the state of each of the edges of each of the design clocks. For each design clock, there are two single-bit values provided on the outputs of the AND gates 655, 660. The AND gate 655 ANDs together the value SCMedgeN, which is high when the Nth design clock needs to toggle, and the value NOT SCMclkN, which is high when the Nth design clock is in the low phase, otherwise low. Thus if the Nth design clock needs to toggle and the Nth design clock is in the low phase, the output of the AND gate 655 is high. Similarly, the AND gate 660 ANDs together the value SCMedgeN, which is high when the Nth design clock needs to toggle, and the value SCMclkN, which is high when the Nth design clock is in the high phase, otherwise low. Thus if the Nth design clock needs to toggle and the Nth design clock is in the high phase, the output of the AND gate 655 is high. Therefore, for each pair of AND gates 655, 660 when the corresponding SCMedgeN signal is high, the pair of AND gate 655, 660 outputs indicates with a high value the state that the design clock will be transitioning into. That is, if the output of the AND gate 655 is high, then the design clock will be transitioning into the high state. If the output of the AND gate 660 is high, the design clock will be transitioning into the low state. This information is gathered for each of the design clocks and combined together into a 32-bit value which is masked with the DEedgeMask by the AND gate 645. If any edge that is in the DEedgeMask (the corresponding bit in DEedgeMask is high) is about to occur (indicated by the state bits generated as discussed above), then the output of the AND gate 645 will be high for that edge, and therefore a high value of one will be propagated through the comparator 640, the sign extender 635, the multiplexer 605, into the subtractor 620. Thus the subtractor 620 subtracts one from the DEinterval value during each design clock phase when an edge in DEedgeMask occurs. The done circuit 235 sets its output, SCMdone, high whenever DEinterval reaches zero.

The done circuit also contains a bank of 64-bit counters which are used to track the total elapsed time and elapsed edges during the simulation run. These counters are set before the simulation run begins, and their values after the simulation run finishes can be used to record how long the SCM 135 ran and how many edges occurred in each design clock. The global time counter is called DEbaseTime and corresponds to the base time value of the software clock facility 120. DEbaseTime increments by the minimum time to the next design clock edge, across all design clocks (SCMminNextEdge) at the start of each simulation clock phase (when SCMstartPhase is high). A global edge counter called DEbaseEdges increments by 1 each time any design clock encounters an edge (when SCMedge* goes high). There are also individual edge counters for each design clock, which correspond to the clock-specific base edge counts of the software clock facility 120. Each of these counters increments by 1 when its corresponding design clock encounters an edge (when the SCMedge* signal goes high).

Figure 7:
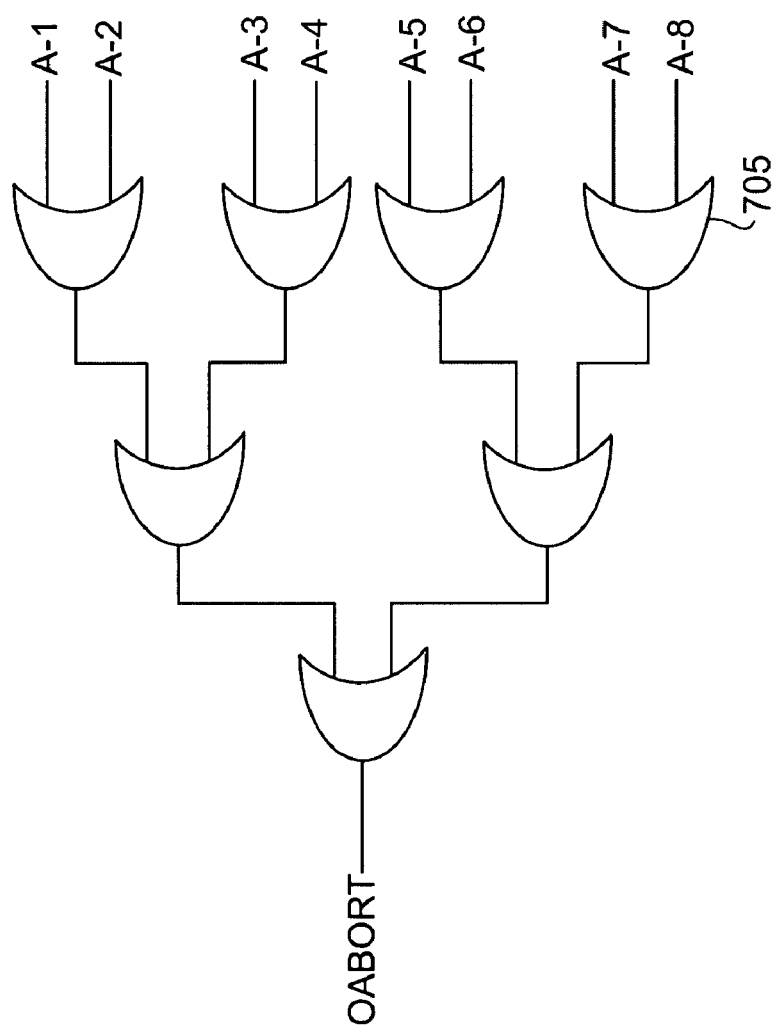
FIG. 7 shows an abort condition tree according to an embodiment of the invention.

Turning to FIG. 7, The abort condition tree 215 is a tree structure of OR gates 705. The abort condition tree 215 takes as inputs various different abort conditions A-1 through A-8 derived from the DUT 130. The particular number of abort conditions and the particular nature of the abort conditions are design choices dependent on the particular DUT 130 being simulated. The abort conditions can include events such as C-model enables, or any other condition that causes the simulation of the DUT 130 on the hardware accelerator box 110 to be aborted. If any of the abort conditions A-1 through A-8 is true (A-N=1), then the abort condition tree 215 propagates a "1" to the output Oabort, which causes an abort signal to be sent to the SCM 135.

Figure 8:
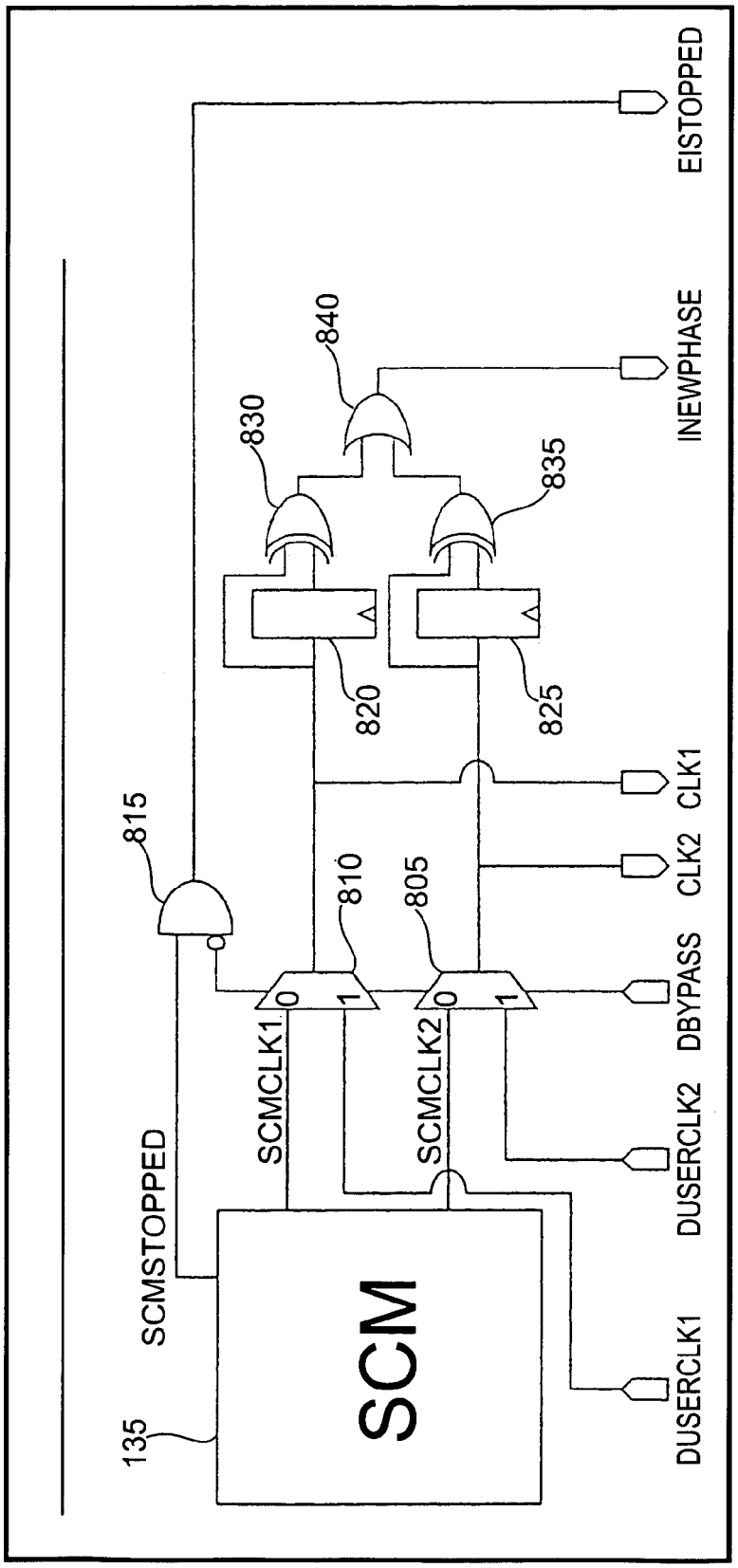
FIG. 8 shows a bypass logic according to an embodiment of the invention.

The overhead associated with interacting with the SCM 135 is intended to be amortized over thousands of clock cycles. Therefore, it is inefficient to incur this overhead where the simulation run will clock only a small number of clock cycles. For this case, maximum performance is obtained by bypassing the SCM 135 and allowing the software clock facility 120 to directly control the DUT 130. Turning to FIG. 8, the bypass logic 230 is placed on the outputs of the SCM 135.

The bypass logic 230 takes as inputs from the SCM 135 the SCMstopped, SCMclk1 and SCMclk2 signals, which indicate respectively the stopped/running state of the SCM 135, and the states of the design clocks Clk1 and Clk2. For ease of discussion, only two design clocks are shown in FIG. 8. As discussed above, the SCM 135 is capable of supporting any number of design clocks. The bypass logic 230 also takes as inputs from the software clock facility 120 the DuserClk1, DuserClk2, and Dbypass signals. These signals indicate respectively the state of the design clocks Clk1 and Clk2 as maintained by the software clock facility 120, and a signal indicating whether or not to bypass the SCM 135. If Dbypass is high, then SCM bypass mode is activated and the software clock facility 120 provides the clock signals for the DUT 130; otherwise the SCM 135 provides the clock signals for the DUT 130.

The bypass logic 230 provides as outputs the signals clk1, clk2, which are the clock signals for the DUT 130, as well as the signal InewPhase, which indicates that at least one design clock has changed phase (from high-low or vice versa), and the signal EIstopped, which indicates whether or not the SCM is in the stopped state.

The Dbypass signal, when high, causes the multiplexers 805, 810 to select the DuserClkN signals for provision to the outputs clk1 and clk2 and to the circuitry used to generate InewPhase. When low, the Dbypass signal causes the multiplexers 805, 810 to select the SCMclkN signals for provision to these outputs. The Dbypass signal also disables the SCMstopped input when Dbypass is high and enables the SCMstopped input when Dbypass is low, using the AND gate 815. Each design clock signal output of the multiplexers 805, 810 is stored in a register 820, 825, and is XOR'ed with the previous design clock signal value stored in the registers 820, 825, to determine if any of the design clocks has changed phase. The outputs of the XOR gates 830, 835 are OR'ed together by the OR gate 840 and the resulting value is sent to the output InewPhase, which is therefore a high value if any of the design clocks clkN have changes phase.

When bypassing the SCM 135, the software clock facility 120 deposits the design clock values directly into registers for use by the DUT 130. The InewPhase signal is derived from the design clock signals, and toggles itself without needing intervention from the host workstation 105. EIstopped stays low as long as the bypass is in effect (i.e. as long as Dbypass is high). For simulation engines without a free-running clock EIstopped being low is not a problem. Oversampling is under control of the software clock facility 120, so the proper number of cycles can be run to achieve the desired oversample rate exactly. For engines with a free-running clock, however, EIstopped being low means that the DUT 130 is continually updating. As long as the minimum number of required cycles are run, there is no problem with using bypass mode on an oversampled design with a free-running clock. Running additional oversample cycles causes no harm. Problems can arise if fewer than the required number of cycles are run between clock updates, or if additional cycles somehow interfere with the correctness of the DUT 130. This can occur when using a direct-mapped design with a free-running clock, making bypass mode unsuitable for this situation. Functional correctness relies on all of the deposits to the hardware accelerator box 110 being committed in a single atomic update.

To use the SCM 135 to generate clock waveforms for the DUT 130, the host workstation 105 sets up all of the clock generator data and oversample data. To set up the clock generators, the host workstation 105 sets the DEclk* values to the current clock values for each design clock, sets the DEvalue0Len* and DEvalue1Len* to the duration of the 0-value phase and 1-value phase, respectively, for each design clock, and DEnextEdge* to the time until the first clock transition for each design clock. The oversample rate is specified by depositing the rate value to the DcyclesPerPhase register. These actions are done once before the SCM 135 is used, and they may need to be performed again if the SCM 135 is used after time is advanced without using the SCM 135, (e.g. during an SCM bypass mode operation).

On each new request for an SCM simulation run, the desired duration of the simulation run is deposited to the DEinterval register, the DEcountTime register is set to indicate the type of value stored in the DEinterval register, and the Dstart signal is brought from a 0 value to a 1 value. The rising edge on Dstart initiates the SCM simulation run, during which the SCM 135 will toggle the design clocks for the specified time period, or until an abort condition occurs.

The host workstation 105 polls the EIstopped signal to determine when the SCM 135 has finished running. Simulators 100 which support breakpoints can use a breakpoint on the EIstopped signal instead of polling. After the SCM run has completed, as indicated by the EIstopped signal, the host workstation 105 probes the SCM state and returns Dstart to 0. When probing the SCM state after a run has completed, the Eaborted signal indicates whether any C models need processing. The DEinterval register can be examined to determine the amount of time advanced by the SCM 135. The registers in the clock generators 210 can be probed to resynchronize the software clock facility 120, and individual C model enables are probed to determine which C models need to be serviced in the event of an aborted SCM run.

If an abort condition does occur, it is handled by the host workstation 105 and the abort condition is cleared. Then if any time remains to be simulated, a new SCM run can be initiated with the data still in the SCM 135 from the aborted run. It is not necessary to reload the SCM data, rather the simulation run can be re-started merely by causing a new rising edge on Dstart.

If an abort is requested by the user (via the control-C key or some other mechanism), the host workstation 105 can deposit a '1' to the DuserAbort signal to abort the run.

The Dstart rising edge mechanism uses additional simulation cycles to detect the rising edge before any actual clocking of the DUT 130 begins, and it uses additional data transfers to return the Dstart signal to a '0' value. When executing a small number of design clock phases (the exact number depends on the characteristics of the simulator 100), it is more efficient to toggle the design clocks directly and eliminate the extra simulation cycles. This is accomplished using the SCM bypass logic 230 discussed above.

To bypass the SCM 135, the host workstation 105 deposits a '1' to Dbypass and the desired design clock values to the DuserClk* signals. To advance to the next phase, the host workstation 105 can simply deposit the new design clock values in a single atomic update. Dbypass can remain high during the entire bypass period, and no additional simulation cycles are required. The tradeoff is that the maximum clock frequency is limited by the communication latency between the host workstation 105 and the hardware accelerator box 110, making bypass mode unsuitable for running a large number of design clock phases that would not otherwise require interaction with the host workstation 105.

An approximate model of SCM operation says that each SCM run requires 2 communication operations between the host workstation 105 and the hardware accelerator box 110 (one to setup the SCM 135 and set Dstart to '1' and one to probe the SCM state and return Dstart to '0') and 2 additional simulation cycles beyond those required by oversampling (the two additional cycles allow for detecting the Dstart edge and settling into the stopped state after the run). If the cost of communication is C, the cost of an simulation cycle is E, the number of cycles per design clock phase is cpp, and the number of design clock phases run by the SCM is n, then the time required for a normal SCM run (without any aborts) is approximately:

$$\text{Time}_{SCM}(C,E,n,cpp) \sim = 2 \times C + (n \times cpp + 2) \times E$$

When bypassing the SCM 135, however, the number of communication operations increases to one per design clock phase while the additional simulation cycles are eliminated:

$$\text{Time}_{BYPASS}(C,E,n,cpp) \sim = (n \times C) + (n \times cpp \times E)$$

Solving these equations to understand when $\text{Time}_{BYPASS} < \text{Time}_{SCM}$ shows that bypass mode is more efficient when $$n < ((2 \times E)/C) + 2$$

Using typical values for the Radium™ simulator, E=130 microseconds, and C=10 microseconds, so bypass mode should be used when n<28. This is assuming an simulation clock of 7.7 kHz and vectorized transfers of a small number of design clock signals. As the number of design clocks changes or the DUT 130 size changes, the crossover point will move.

The SCM can be safely bypassed on simulators 100 with free-running clocks only because of support from the simulation interface layer that guarantees that at least the required number of oversample cycles occur between design clock value updates. For real-world designs on the COBALT™ simulator, which have 200 or more Direct Applied Stimulas (DAS) input pins, E>=2.56 microseconds and C>=1.4 microseconds. Because the simulator cycle time is so fast and the communication latency so long, the efficiency gain in bypass mode is limited to runs of fewer than 6 design clock phases—and this number is highly sensitive to the step count and DAS input pin count.

These estimates do not apply when interaction between the host workstation 105 and the hardware accelerator box 110 is required. In that case, the SCM 135 should always be bypassed unless the interaction can be made to occur infrequently enough to justify the SCM 135, using buffering or pre-fetching techniques. The SCM 135 should not be bypassed with direct-mapped designs with free-running clocks. In that case, the additional oversample cycles of the free-running clock will interfere with the correctness of the simulation.

The SCM 135 and software clock facility 120 are synchronized before an SCM run begins and then resynchronized after the run is complete. This synchronization is performed through a special function, CLKsynchronize( ), built into the software clock facility API. Synchronization works because the SCM 135 and software clock facility 120 states are transferable from one to the other, since both entities implement the same clock generation algorithm. This allows the synchronization task to be simple, fast and reliable. Full details of the software clock facility are discussed below.

CLKsynchronize( ) works by repeatedly invoking a callback function with state elements of the clock generators. At each invocation the callback can use the supplied state, and can also modify the state of the clock generator. The SCM layer 123 uses two callbacks with CLKsynchronize( ):SCM-setupBeforeRun( ) is used to set up the SCM registers in preparation for using the SCM 135 in non-bypass mode, and SCMsyncAfterRun( ) is used to re-synchronize the software clock generators after an SCM run has completed. These two callbacks are shown in Tables 9 & 10 below.

TABLE 9

CLKsynchronize( ) callback used to set up the SCM with data from the software clock manager before initiating an SCM run.

```
PRIVATE  int
         SCMsetupBeforeRun(tClkSyncQuery query, tUint32 dom,
         tUint64* pQueryData, void* pUserData);
         switch (query)
         {
         case CSQ_ELAPSED_TIME:
         set DEbaseTime to (*pQueryData)
         case CSQ_ELAPSED_PHASES:
         if (dom == ANY_DOMAIN)
         set DEbaseEdges to (*pQueryData)
         else
         set DEbaseEdges* for dom to (*pQueryData)
         case CSQ_WAVE_PARAMS:
         set DEclk* for dom to (*pQueryData) & (1<<31)
         set DEnextEdge* for dom to (*pQueryData) & 0x7FFFFFFF
         case CSQ_PHASE_LENGTHS:
         set DEvalue0Len* for dom to (*pQueryData) & 0xFFFFFFFF
         set DEvalue1Len* for dom to
         (*pQueryData >> 32) & 0xFFFFFFFF
         default:
         error
         }
```

TABLE 10

CLKsynchronize( ) callback used to re-synchronize the software clock manager after completing an SCM run.

```
PRIVATE  int
         SCMsyncAfterRun(tClkSyncQuery query, tUint32 dom,
         tUint64* pQueryData, void* pUserData);
         switch (query)
         {
         case CSQ_ELAPSED_TIME:
         set (*pQueryDat) to DEbaseTime
         case CSQ_ELAPSED_PHASES:
         if (dom == ANY_DOMAIN)
         set (*pQueryData) to DEbaseEdges
         else
         set (*pQueryData) to DEbaseEdges* for dom
         case CSQ_WAVE_PARAMS:
         set (*pQueryData) to DEnextEdge* | (DEclk* << 31)
         case CSQ_PHASE_LENGTHS:
         set (*pQueryData) to DEvalue0Len* | (DEvalue1Len* << 32)
         default:
         error
         }
```

Other SCM registers, such as DEinterval, DEcountTime, and DcyclesPerPhase are also set before initiating an SCM run, but these values are supplied by the user or other iteration requester not by the software clock facility.

The SCMsetupBeforeRun( ) callback loads the SCM registers with the state of the software clock facility. The SCMsyncAfterRun( ) callback simply reverses the process by restoring the software clock facility state from the SCM registers.

The primary purpose of the SCM 135 is to generate clock waveforms to stimulate the DUT 130. This is always done using the same mechanism, but depending on the inputs different results can be obtained.

Figure 9:
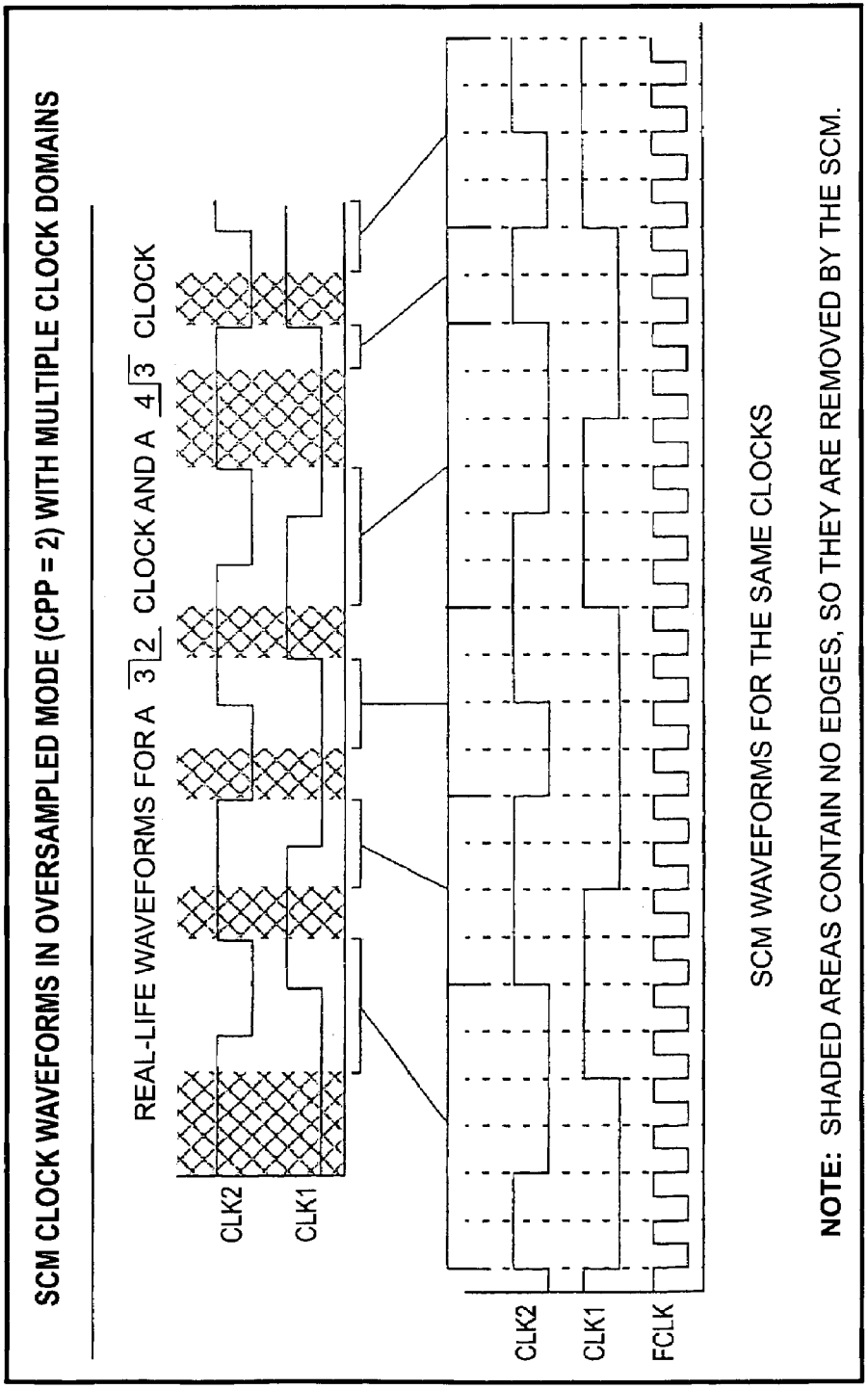
FIG. 9 shows clock waveforms in oversampled mode, depicting the time compression of an embodiment of the invention.

Turning to FIG. 9, oversampled mode waveforms generate only the necessary clock edges and "compress" the time between clock edges when no useful computation happens. This is the default behavior of the SCM 135, and occurs whenever the SCM 135 is used with multiple clock domains. FIG. 9 depicts two SCM clock waveforms in oversampled mode, with cpp=2. clk1 has a high phase that lasts 3 time units, followed by a low phase that lasts 2 time units. c12 has a low phase that lasts 4 time units followed by a high phase that lasts 3 time units. The shaded portions of the two real-life waveforms for clk1 and clk2 indicate the time units where neither clock contains an edge. Since events in the simulation happen only on clock edges, these time units need not be simulated, because it is known that nothing will happen in the simulation on these time units. This yields the SCM waveforms shown in FIG. 9. fclk is the simulation clock waveform. clk2 and clk1 are the two design clock waveforms, expanded because of the oversampling rate of 2.

Direct-mapped clock generation is supported using the same SCM circuits as oversampled clock generation (only one design clock generator is used since direct-mapped designs cannot support multiple clock domains). Using the same technique as the software clock generation algorithms, direct-mapped operation is enabled by setting one phase length to 0 and the other to the clock period. During direct-mapped operation, the SCM 135 counts down one design clock cycle per simulation clock cycle, and the SCM design clock outputs do not toggle and are not connected to any loads. Therefore, direct-mapped operation is only effective when the DUT 130 has undergone direct-mapped transformations. Enabling direct-mapped operation on a DUT 130 which has been transformed for oversampling will produce an error; it is the responsibility of the caller not to attempt it.

In direct-mapped mode, the SCM 135 does not directly support starting and stopping in between design clock edges. If this behavior is desired, it must be done in the software clock facility 120 by advancing to the first edge, using the SCM 135 to advance all cycles up to the last edge, and then advancing in software again from the last edge to the desired intermediate point.

When used in-circuit or with data captured from real-world devices, the time "compression" feature of oversampled clock generation cannot be used because the timing relationships of real-world clocks must be maintained. The user must announce their intention to "go in-circuit" at compile-time. This will allow the compiler to synthesize a different min circuit 220 with an additional input. This input can be used to ensure that time advances in a regular manner by setting it to '1'. Additional efficiency can be obtained by allowing this input value to be held in a register, which can be deposited with the greatest common divisor of the user-defined clock phase lengths.

The SCM layer 123 is structured so that it can be used without an SCM 135 in a transparent manner. When no SCM 135 is present, it is essentially identical to bypass mode with an SCM 135, except that deposits go directly to the clock values instead of to DuserClk*. This is intended to allow hardware accelerator boxes 110 that do not support SCMs to share the same code and logical structure with hardware accelerator boxes 110 that do support SCMs.

The SCM 135 is created within its own top-level SCM hierarchy during the transformation stage of the compilation process. Some parts of the SCM 135 are identical across different DUTs 130 being simulated, such as the finite state machine 205 and the oversampler circuit 225. Other parts of the SCM 135 vary depending on the DUT 130, and are made by replication of the same circuit patterns once for each design clock, such as the clock generators 210 and min/done circuits 220, 235. The abort condition tree 215 is created as a simple OR-tree of all C model enables, external abort signals and a user abort signal.

The only information necessary to decide what logic to generate for the SCM is: the number of design clocks, the identities of the clock signals associated with each design clock, and the identities of all C model enables. This list can be expanded in the future, if for example, more advanced oversampler circuits are developed which require additional inputs.

Figure 10:
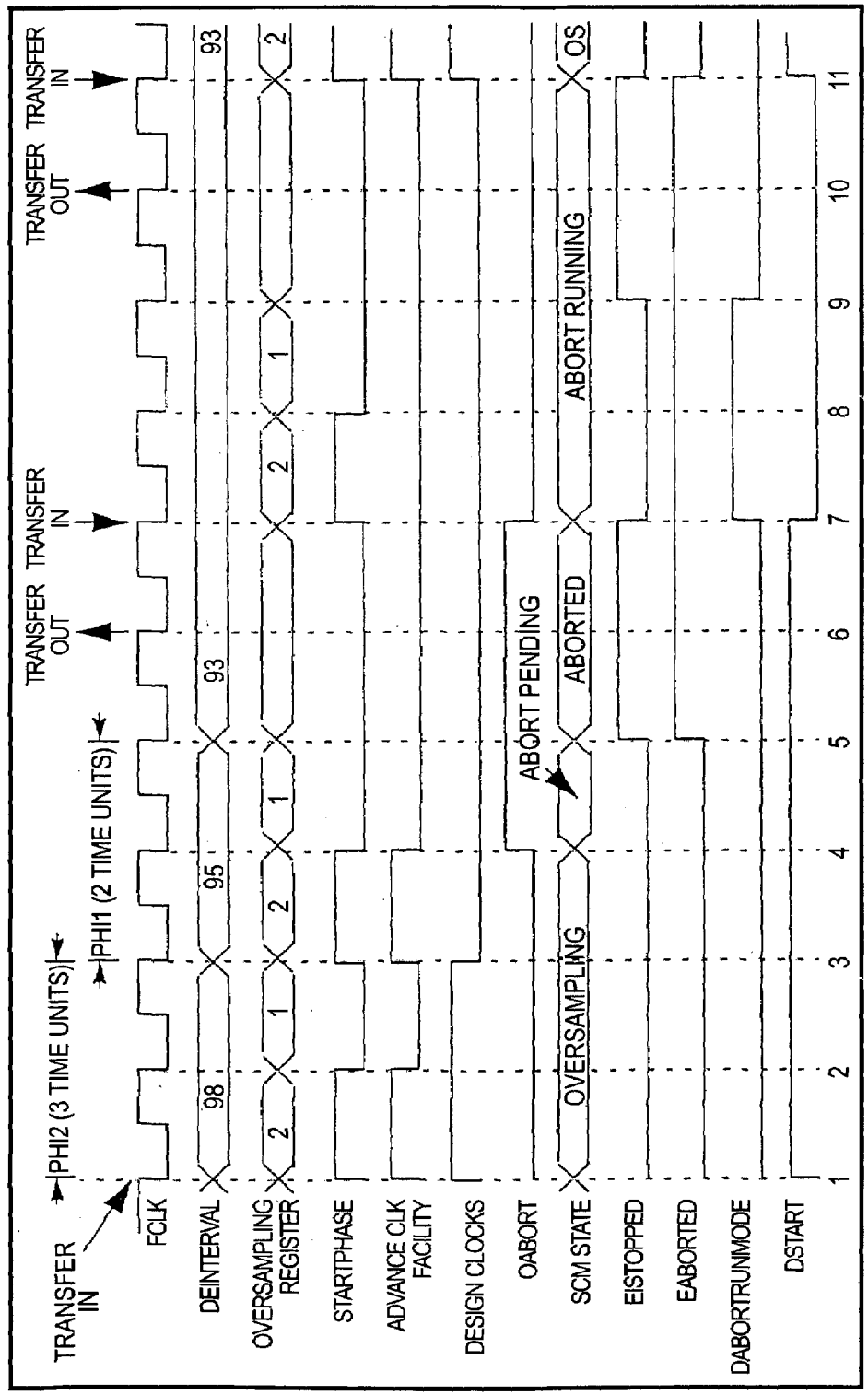
FIG. 10 shows a timing chart of a representative example of the operation of the simulator of an embodiment of the invention.

An illustrative example of the timing diagram from an operation of the simulator 100 with the SCM 135 is shown in FIG. 10. The timing diagram is for a typical simulation run, and illustrates value transitions on SCM signals. The timing diagram also contains an illustration of how an abort condition from the DUT 130 is handled. The SCM 135 has been set up for a cpp value of two oversample cycles. A single two-phase design clock has been defined, having a phi 1 phase length of two time units and a phi 2 phase length of three time units.

The user requests a simulation run of one hundred time units, which causes DEinterval to be initialized with a value of 100. The design clock is initialized to 0 which is the phi2 state. In addition, the design clock is currently at the instant of time just before a rising edge. The flow of data and control between the host workstation 105, the DUT 130 and the SCM 135 is shown across the top of FIG. 10.

The first data transfer from the host workstation 105 to the hardware accelerator box 110 prior to the first falling FCLK edge (FCLK represents the base simulation clock for the hardware accelerator box 110) initializes the SCM 135 and the clock generators 210. The oversampler circuit 225 is loaded with the oversample rate cpp=2, the register DEinterval is loaded with the simulation run time of 100 time units. On the first falling edge of FCLK at T=1, the SCM 135 outputs the startPhase signal which causes the clock generator 210 to advance time to the next design clock edge, which is two time units into the future. The register DEinterval is decremented by two time units, and now reads 98 time units remaining in the simulation run. At the second falling edge of FCLK (T=2), the oversample circuit 225 decrements its count from 2 to 1. Since the oversample circuit 225 is not at zero, the SCM 135 pulls the startPlase signal low. Upon the third falling FCLK edge (T=3), the oversample circuit decrements its count to zero which causes it to load the cpp value and pull the startPhase signal high. The high startPhase signal causes the clock generator 210 to advance time and toggle the design clock to change phase from high to low. Time is now advanced by three time units, since this is the next phase length.

On the fourth falling FCLK edge (T=4), the DUT 130 outputs an abort signal, Oabort. Since the oversample circuit has not reached zero, the SCM 135 goes into the abort pending state 318, at T=4. This causes the SCM 135 to complete the oversampling of the DUT 130. When the oversample circuit reaches zero, at T=5, the SCM 135 goes to the aborted state 320 and outputs the EIstopped and Eaborted signals. This stops the SCM 135 from advancing time in the DUT 130. Also, at T=6 the host workstation 105 that polls for the EIstopped signal initiates a transfer of the relevant signal values from the hardware accelerator box 110 to the host workstation 105 in response to the EIstopped signal. These signal values are used by the host workstation 105 to process the abort.

Suppose the software model being processed by the host workstation 105 in response to the abort is a combinational model. To process a combinational model, the output signals of the software model are transferred into the hardware accelerator box 110 and the propagated through the combinational logic of the DUT 130. The host workstation 105 will set up the SCM 135 through a data transfer to perform a single oversample of the DUT 130 without advancing simulation time or advancing the design clocks in the design clock generators 210. This is accomplished by placing the SCM 135 in the abort running state 325 as shown at T=7. In this state, the oversample circuit counts down the required oversample cycles without advancing simulation time in the SCM 135.

After the oversample circuit has completed the oversamples, the SCM outputs the EIstopped signal at T=9, and control is transferred back to the host workstation 105 at T=10. The host workstation 105 can transfer control back to the SCM 135 at a later stage, to continue the original requested simulation run, for example at T=11 control is transferred back to the SCM 135 to continue the simulation run.

Turning to the details of the software clock facility 120, the software clock facility is the central authority on time and clock waveforms in the host workstation 105. All clock- or time-related data and manipulation routines are part of the software clock facility 120. When design clocks are created, they are registered with the software clock facility 120. The software clock facility 120 is responsible for saving all clock and time information to long term storage and restoring it during run-time. During simulation, the host workstation 105 can query the software clock facility 120 to find the current time or the time of the next edge. The host workstation 105 can easily iterate over all edges up to a point in time specified in one of three ways: in terms of elapsed time, in terms of the number of clock edges of a particular design clock, or in terms of the total number of clock edges in a set of multiple (possibly all) design clocks.

The software clock facility 120 will also help to better define time 0, the instance of time just after the simulator 100 starts, but before the first clock step. For the software clock facility 120 to work without a special case for time 0, there must exist at least one edge from any design clock at time 0. Therefore, the default behavior for a design clock will be executing a negative edge transition for its phase 1 clock (positive edge for its phase 2 clock) at time 0. The software clock facility 120 is not responsible for modifying clock signal values, rather the SCM layer 123 is given this responsibility, at the direction of the software clock facility 120.

The software clock facility 120 is a self-contained clock and time manager. Its external interface consists of a few data types and a number of routines which manipulate them. All software clock facility 120 interface functions begin with the prefix "CLK". The software clock facility 120 itself is embodied in a tClockManager structure, which is created through a call to CLKcreateManager( ) and destroyed using CLKreleaseManager( ). Most other software clock facility 120 routines require a tClockManager* to be passed in as their first argument. This allows multiple clock managers to exist simultaneously, though no application of this currently exists.

In addition to the clock manager itself, as shown in Table 11 below, the clock manager interface exports the tMagnitude enumerated type, which represents the order-of-magnitude of a timescale, ranging from attoseconds ($10^{-18}$ s) to seconds. The tMagnitude is used in conjunction with a 32-bit length field to make up the tTimeScale structure. The interface also makes use of the tClkMask type to represent the set of clock states in a compact and portable form, and the tEdgeMask type to represent all combinations of rising and falling edges in all domains.

TABLE 11

| PUBLIC | #define CLK_INVALID_DOMAIN 0 |
|---|---|
| | #define CLK_ANY_DOMAIN (~0) |
| | #define CLK_MAX_PHASE_LENGTH ((1<<31)−1) |
| | typedef enum { |
| | MAG_S=0, MAG_MS, |
| | MAG_US, MAG_NS, MAG_PS, MAG_FS, MAG_AS |
| | } tMagnitude; |
| | typedef struct { |
| | tUint32 length; |
| | tMagnitude magnitude; |
| | } tTimeScale; |
| | typedef struct { |
| | unsigned edges:16; |
| | unsigned levels:16; |
| | } tClkMask; |
| | typedef tUint32 tEdgeMask; |
| | typedef struct tClockManager__ tClockManager; |
| PRIVATE | struct tClockManager__ |
| | { |
| | . . . |
| | }; |

Figure 11:
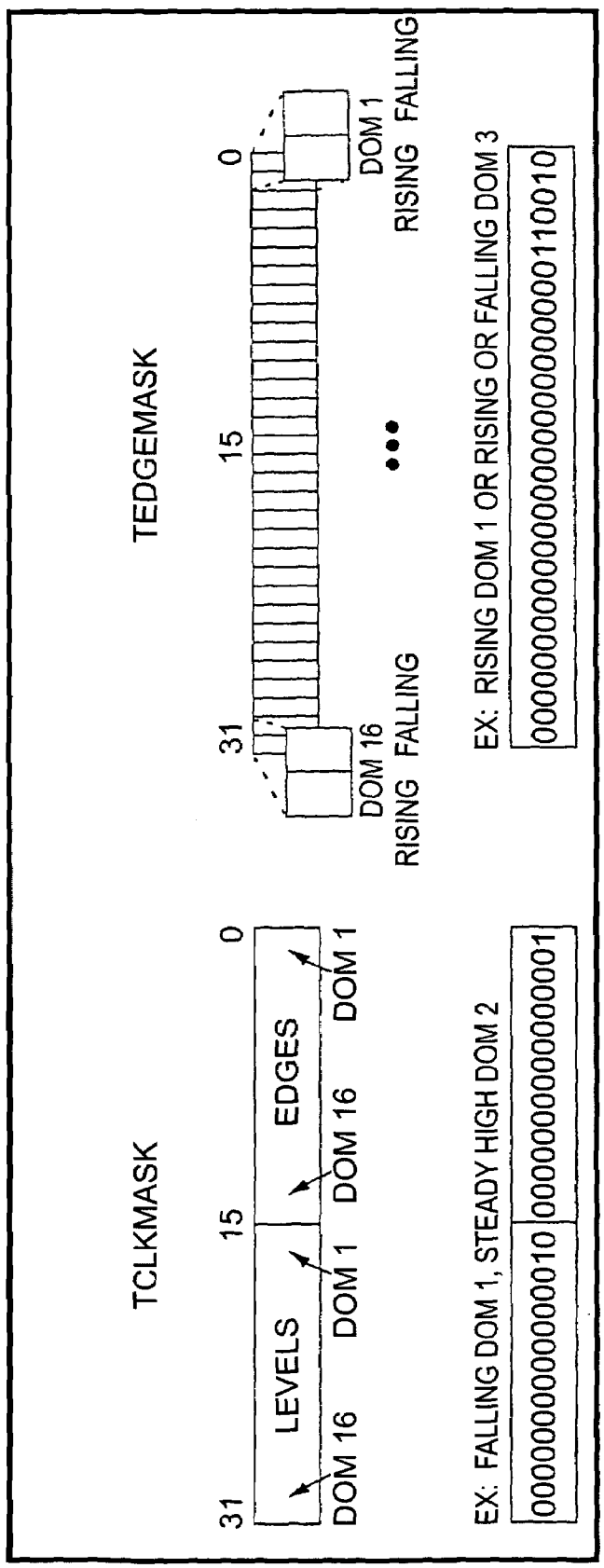
FIG. 11 shows a clock mask and an edge mask according to an embodiment of the invention.

Turning to FIG. 11, the layout of the tClkMask and tEdgeMask structures are shown. The tClkMask structure includes 32 bits, the lowest 16 bits being a mask of the state of the edges of each of the design clocks configured for the simulator 100, and the highest 16 bits being a mask of the state of the levels (high or low) of each of the design clocks configured for the simulator 100. The example tClkMask selects for a falling edge on clock 1, and a steady high level for clock 2. The tEdgeMask structure includes 32 bits, organized as 16 pairs of bits each representing the rising and falling state of each of the design clocks configured for the simulator 100. The example tEdgeMask selects for a rising edge on clock 1, or either a rising or falling edge on clock 3.

The first step in using the software clock facility 120 is to create a clock manager using the CLKcreateManager( ) function of Table 12 below. In this example embodiment, this returns a pointer to a tClockManager structure with no defined design clocks and a default timescale of 1 nanosecond. The default behavior of the tClockManager structure is a design choice for the programmer and is not critical.

TABLE 12

| | Create an instance of a clock manager. The manager created has no domains defined and uses the default time scale of 1ns. Returns a pointer to the allocated tClockManager structure or NULL on error. |
|---|---|
| PUBLIC | tClockManager* CLKcreateManager(tDes* pDes); tUIcallbackFn pHiResFn, void* pUserData); |

After creating the clock manager, the timescale can be specified with a call to CLKsetTimeScale( ), shown in Table 13 below. The timescale is a unit of time which serves as the basic unit of measurement for measuring time. The timescale is defined using an (unsigned int length, tMagnitude magnitude) pair. The timescale is the product of the length and the order of magnitude, so the timescale (5, MAG_NS) represents a timescale of 5 nanoseconds. Any later interactions with the clock manager do not need to specify a time scale—the requested time is automatically multiplied by the current timescale. The timescale is set after the clock manager is created and before any design clocks are created.

TABLE 13

| | Set the time scale used for specifying times. The time scale is the smallest unit of time which can be set with the clock facility and the base unit for all times passed to and returned from the software clock facility. "pTimeScale" is a pointer to a tTimeScale structure, whose "length" member is the number f time periods and "magnitude" member is the order of magnitude of each time period. Returns 0 n success, non-zero otherwise. |
|---|---|
| PUBLIC | int CLKsetTimeScale(tClockManager* pClkMgr, tTimeScale* pTimeScale); |

The timescale can be queried using the CLKgetTimeScale( ) function of Table 14 below. The timescale returned will be equivalent to the timescale defined using the CLKsetTimeScale( ) function, but it maybe specified differently. For example, the timescale (20000, MAG_NS) may be returned as (20, MAG_US).

TABLE 14

| | Get the time scale used for specifying times. The time scale is the smallest unit of time which can be used with the clock facility and the base unit for all times passed to and returned from the clock facility. "pTimeScale" is a pointer to a tTimeScale structure, whose contents will be overwritten with the current timescale values. |
|---|---|
| PUBLIC | void CLKgetTimeScale(tClockManager* pClkMgr, tTimeScale* pTimeScale); |

When initially created, the clock manager has no defined design clocks. In an embodiment, up to 16 design clocks can be defined with the CLKcreateDomain( ) API function shown in Table 15 below. In other embodiments, different maximums are imposed. The maximum design clocks possible is a design choice and is not critical to the disclosed embodiment of the invention. The call returns a design clock number from 1 to 16 corresponding to the design clock created, or INVALID_DOMAIN on error. This design clock number is needed to refer to the design clock in other calls.

TABLE 15

Creates a new design clock.
The design clock created defaults
to a 50% duty cycle and phase lengths of
one timescale unit, with the first
edge occurring at time 0.
Returns the number of the design clock created or
INVALID_DOMAIN on error.

| | |
|---|---|
| PUBLIC | unsigned int<br>CLKcreateDomain(tClockManager* pClkMgr); |

Figure 12:
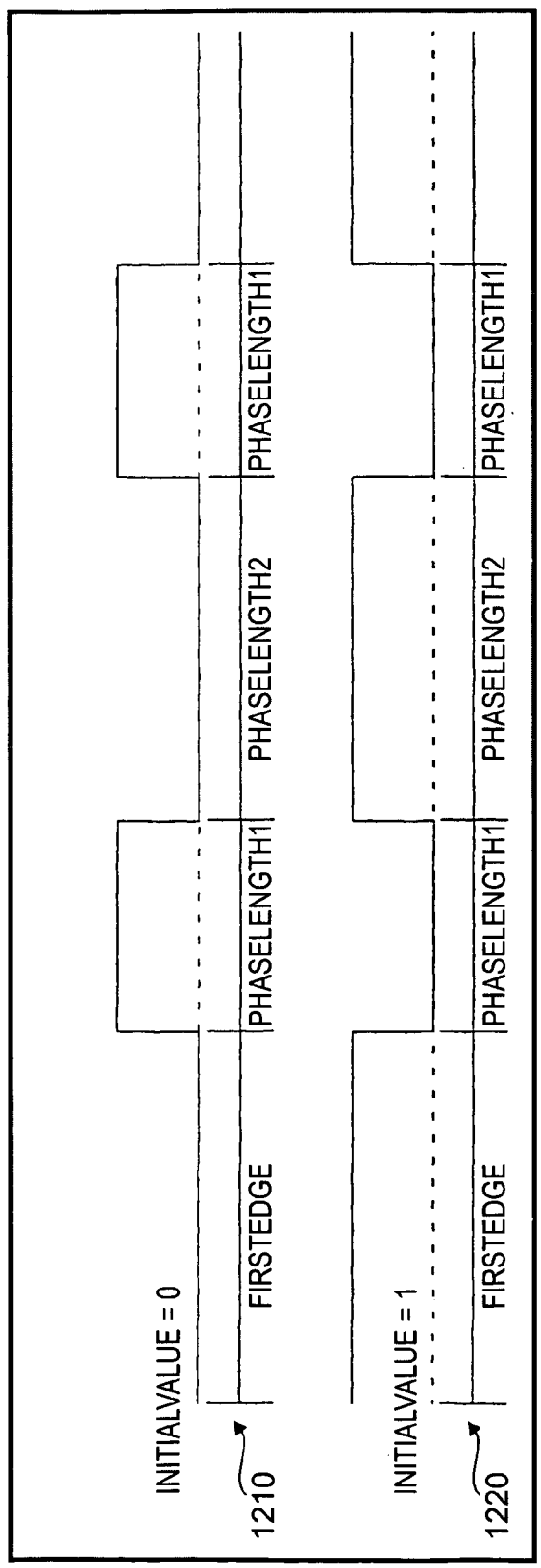
FIG. 12 shows waveforms of representative clock signals of an embodiment of the invention.

The design clock created by CLKcreateDomain( ) defaults to a 50% duty cycle and phase length of one timescale unit, with the first edge being a rising edge at time 0. These parameters can be modified to alter the design clock's waveform by calling CLKsetDomainParameters( ) for that design clock, shown in Table 16 below. The controllable parameters are the length of each phase, the initial value, and the delay before the onset of phase 1. The clock values during each phase are determined from the initial value. Specifically, the initial value is the clock value before the first edge, the value during phase 1 is the opposite of the initial value and the value during phase 2 is equal to the initial value. The resulting waveforms are shown in FIG. 12. The first waveform 1210 is for an initial value of 0, the second waveform 1220 is for an initial value of 1.

TABLE 16

Sets the parameters for the behavior of a design clock.
The phase length variables determine the duration of the
first and second phases of the clock, and must be <2^31.
"initialValue" specifies the value of the clock before any edge
has occurred and must be either 1 or 0. "firstEdge" specifies
when the first edge will occur. "dom" must refer to a single
previously created design clock. At least one of the
phase length arguments must be non-zero.
Returns 0 on success, non-zero otherwise.

| | |
|---|---|
| PUBLIC | int<br>CLKsetDomainParameters(tClockManager* pClkMgr, tUint32 dom,<br>tUint32 phaseLength1,<br>tUint32 PhaseLength2,<br>unsigned int initialValue,<br>tUint32 firstEdge);<br>store the given design clock data in the<br>specified design clock's data<br>structures<br>remove any edge for the design clock from the queue<br>add a new edge for the design clock to<br>the edge queue at a point<br>firstEdge in the future |

The clock facility can work with multiple slots, as in Simultaneous Test (ST) mode, or it can work with a single slot when the underlying simulator 100 does not support the ST feature. To support ST, each slot has its own notion of the current time, which can be queried using the CLKgetTime( ) function shown in Table 17 below. The time returned by CLKgetTime( ) will be relative to the timescale defined for the clock manager. The CLKgetElapsedEdges( ) function shown in Table 18 below allows time to be queried in terms of the elapsed number of edges in a particular design clock or in all design clocks.

TABLE 17

Returns the current simulation time as
understood by the specified slot,
relative to the timescale.

| | |
|---|---|
| PUBLIC | tUint64<br>CLKgetTime(tClockManager* pClkMgr, int slot); |

TABLE 18

Returns the number of elapsed edges of the
given domain since the last reset of the specified slot.

| | |
|---|---|
| PUBLIC | tUint64<br>CLKgetElapsedEdges(tClockManager* pClkMgr, tUint32 dom, int slot); |

Times returned for each slot are relative to the most recent call to CLKresetSlot( ), shown in Table 19 below. When advancing time, all slots advance together. Each slot may show a different time or number of elapsed edges, but all agree on the clock waveforms. Stated differently, the clock edges are always aligned across all slots, but the number of elapsed edges may differ from one slot to the next. For this reason, CLKresetSlot( ) may fail to honor an initial delay when using multiple slots and clocks with initial edge delays, as this could cause edges to become mis-aligned across slots.

It is illegal to attempt to reset a slot when the clock conditions are not in their final state. Specifically, when multiple slots are in use and the clock conditions are not identical to the initial clock conditions, the call to CLKresetSlot( ) can fail. The call will never fail when only a single slot is active. Instead, the clock conditions will be reset to their initial conditions and the call will succeed. The CLKcanSlotBeReset( ) function of Table 20 below is provided to indicate when it is safe to reset a slot. When CLKcanSlotBeReset( ) returns non-zero, a call to CLKresetSlot( ) is guaranteed to succeed up until time is advanced.

TABLE 19

Resets the time information for the specified
slot to its initial state. Returns 0 on success and
non-zero on failure. Failures may occur when
multiple slots are in use and a reset is attempted
when the next clock phase will not have all clocks
at their initial values. When an error occurs, the
slot's state is not changed.

| | |
|---|---|
| PUBLIC | int<br>CLKresetSlot(tClockManager* pClkMgr, int slot);<br>if unable to reset at this time, return error<br>reset elapsed phases to 0<br>reset current time to 0 |

TABLE 20

Returns TRUE if and only if a subsequent
call to CLKresetSlot( ) will succeed.

| | |
|---|---|
| PUBLIC | int<br>CLKcanSlotBeReset(tClockManager* pClkMgr);<br>return true if only 1 active slot or if clocks match initial conditions |

The current state of the domains can be queried using the CLKgetClockMask( ) function call shown in Table 21 below. This call returns a tClkMask structure which describes the current state of all design clocks, including edges that occurred at the current time.

TABLE 21

Returns a clock mask representing the current state of the clocks.

PUBLIC  tClkMask
        CLKgetClockMask(tClockManager* pClkMgr);

The clock manager can be queried for the amount of absolute time (in units of the timescale) before the next edge occurs by using the CLKgetNextEdgeTime( ) function of Table 22 below. This function can be used to find the time to any edge or to an edge in a specific design clock or set of design clocks, and can distinguish between rising and falling edges. Also, edges that occur at the current time can be skipped.

TABLE 22

The "edgeMask" argument specifies which edges in which design clocks to count. The function returns the time until the next edge which matches edgeMask. If "edgeMask" is ANY_DOMAIN, the function returns the time until the next edge will occur in any design clock. If the "skip" argument is non-zero, then edges that occur at the current time are not counted.

PUBLIC  tUint32
        CLKgetNextEdgeTime(tClockManager* pClkMgr,
        tEdgeMask edgeMask, int skip);
        find the first edge from a requested design clock in the
        queue that is not to be skipped if it matches an edge
        in edgeMask
        return edge.time − timeCounter
        else
        return edge.time + phase length − timeCounter To advance time, the clock manager provides a simple function called AdvanceTime( ) shown in Table 23 below. This is a private function of the clock manager, used only by the clock manager's own iterator functions. AdvanceTime( ) advances to the time of the next clock edge, unless that edge falls beyond the supplied limit argument. The function takes a tClkMask structure representing the current clock state and returns a tClkMask structure representing the new clock state.

TABLE 23

Advances time to the next edge, or "limit" time units if the next edge is more than "limit" units in the future.
If no limit is desired, pass a "limit" argument of MAX_PHASE_LENGTH. Returns a tClkMask structure representing the state of the clocks at the new moment in time, constructed from the "mask" argument which represents the prior state of the clocks.

PRIVATE tClkMask
        AdvanceTime(tClockManager* pClkMgr, tClkMask mask,
        tUint32 limit);
        mask.edges = 0
        while queue[0].time = timeCounter
        remove queue[0]
        update mask
        add opposite edge into queue at timeCounter + phase length
        timeCounter = min (queue[0].time, timeCounter + limit)
        return mask The clock manager considers edges to occur upon passing the edge time, so stepping to the exact moment of an edge does not trigger the edge. It is only when moving beyond that point in time that the edge is triggered. Note, however, that when advancing time from the exact moment of an edge, the edges at that time are triggered, but time is advanced to the moment of the next set of edges, which themselves will be triggered during the next call to AdvanceTime( ).

The clock manager uses the AdvanceTime( ) function to support different modes of iteration. Iteration intervals can be specified in terms of absolute time, in terms of clock edges of a particular design clock, or in terms of clock edges in a set of design clocks. In the iteration idiom of an embodiment, the first call defines the iteration interval and all subsequent calls specify an interval of 0. Repeated calls will return clock masks representing successive clock transitions until all transitions in the specified interval have been returned. After all requested edges have been returned, additional calls will return NULL. There are two iterators: CLKiterateTimeUnits( ) specifies the iteration interval in time units as shown in Table 24 below, and CLKiterateEdges( ) specifies the iteration interval as the number of edges in a particular domain or in a set of domains, as shown in Table 25 below.

TABLE 24

CLKiterateTimeUnits( ) is used to advance time by a given amount.
The first call should give a non-zero "duration" argument; this duration sets the iteration interval. Subsequent calls should give a duration of 0. Each call will return a tClkMask structure specifying the next state of the clocks in the iteration interval. When the function returns a tClkMask with no edges, there are no transitions remaining in the interval.

PUBLIC  tClkMask
        CLKiterateTimeUnits(tClockManager* pClkMgr, tUint64
        duration);
        if (duration > 0)
            set the interval to duration
        if (interval > 0)
            startTime = timeCounter
            clkMask = AdvanceTime(pClkMgr, clkMask,
            min(interval, MAX_PHASE_LENGTH));
            interval −= timeCounter − startTime;
            update edge counts
            return clkMask
        else
        return 0

Iterating using time units can be dangerous. If a time is specified which ends in-between clock edges, the simulation will not behave as expected. For example, Verilog(tm) #delays will not work, and deposits to registers may or may not take effect. Behavior may differ between normal and single-edge modes. This functionality is useful when co-simulating with event-based simulators or for handling a wide variety of test benches.

Note that simultaneous edges are counted as a single event in CLKiterateEdges( ). This is because edges which occur at the same instant of time are inseparable. If simultaneous edges were not counted as a single event, then the caller could request that one edge occur but not the other. This is not a physically realizable request and the convention is therefore chosen to eliminate the possibility.

TABLE 25

Used to advance time by a given number of clock edges.
"numEdges" specifies the number of edges,
and "edgeMask" specifies which edges of
which design clocks are to be counted. If "edgeMask" is
ANY_DOMAIN, edges in all design clocks
are counted, otherwise only edges with their corresponding
bit set in "edgeMask" are counted.
Edges which occur simultaneously
are counted as a single event.
An "edgeMask" of 0 is invalid.
The first call should give a non-zero "numEdges" argument;
this sets the iteration interval. Subsequent
calls should give a "numEdges" argument of 0.
Each call will return a tClkMask structure
specifying the next state of the clocks in the
iteration interval. When the function returns a tClk-Mask
with no edges, there are no transitions
remaining in the interval.

| | |
|---|---|
| PUBLIC | tClkMask<br>CLKiterateEdges(tClockManager* pClkMgr,<br>tEdgeMask edgeMask, tUint64 numEdges);<br>if (numEdges > 0)<br>    set interval to numEdges and<br>    matchEdgeMask to edgeMask<br>if (interval > 0)<br>    clkMask = AdvanceTime (pClkMgr, clkMask,<br>    MAX_PHASE_LENGTH);<br>    if (EdgesMatch (clkMask, matchEdgeMask))<br>        interval --<br>    update edge counts<br>    return clkMask<br>else<br>    return 0 |

The CLKdisableDomain( ) function of Table 26 below can be used to suppress edges in a design clock. A disabled design clock supports only a subset of the clock facility functionality until it is re-enabled using the CLKenableDomain( ) function of Table 27 below. A call to CLKdisableDomain( ) will fail if disabling the design clock would leave no enabled design clocks. While disabled, the behavior of any functions which require edges in the design clock is undefined. These functions include CLKiterateEdges( ) and CLKgetNextEdgeTime( ) if the disabled design clock is specified in the "dom" argument.

TABLE 26

Disables a design clock by preventing the clock manager
from reporting any edges in that design clock
until it is re-enabled by a call to CLKenableDomain( ).
"dom" must be a single previously defined and
enabled design clock. The design clock is only truly
disabled when all active slots have called
CLKdisableDomain( ). Returns 0 on
success, non-zero otherwise.

| | |
|---|---|
| PUBLIC | int<br>CLKdisableDomain(tClockManager* pClkMgr, tUint32 dom,<br>int slot);<br>if all slots disabled, remove edges for design clock dom from<br>the edge queue |

Calling CLKdisableDomain( ) does not necessarily disable the design clock. The design clock is disabled once all active slots have requested it be disabled. A disabled design clock is re-enabled if any active slot requests that it be re-enabled.

When enabling a design clock with the CLKenableDomain( ) call, it is often desirable to enable the design clock in a different state than the one in which it was disabled. This is accomplished by providing a starting value and first edge delay as arguments to the CLKenableDomain( ) call. This does not change the initial value or delay of the design clock. It is used only for restarting this design clock. If the initial value argument is the same as the initial value for the design clock (specified in the CLKsetDomainParameters( ) call) then the clock phase which follows the first edge will last for phaseLength1 time units, otherwise it will last for phaseLength2 time units. It is the responsibility of the caller to know the state they want the design clock to assume when it is enabled. If the intended behavior is to resume in the same state in which it was disabled, the caller must store this state and provide it to the CLKenableDomain( ) call.

TABLE 27

Enables operation of a design clock disabled
using CLKdisableDomain( ). The initial value of the design
clock is given by "initialValue" and must
be 0 or 1 and the first edge
will occur "firstEdge" time units in
the future. The timing of subsequent edges will use the
appropriate phase length, according to the
specified initial value. "dom" must be a single
previously defined and disabled design clock. Returns 0
on success, non-zero otherwise.

| | |
|---|---|
| PUBLIC | int<br>CLKenableDomain(tClockManager* pClkMgr, tUint32 dom,<br>unsigned int initialValue, tUint32 firstEdge);<br>add an edge for design clock dom in the queue at firstEdge<br>units from now |

When the clock manager is no longer needed, its resources can be reclaimed by calling CLKreleaseManager( ), as shown in Table 28 below. After the call returns, the tClockManager* is invalid and should not be used.

TABLE 28

Release the resources used by an instance of a
clock manager created by the CLKcreateManager( )
function.

| | |
|---|---|
| PUBLIC | void<br>CLKreleaseManager (tClockManager* pClkMgr);<br>release all resources used by the clock manager |

Beneath the software clock facility API is a data structure and clock generation algorithm.

Figure 13:
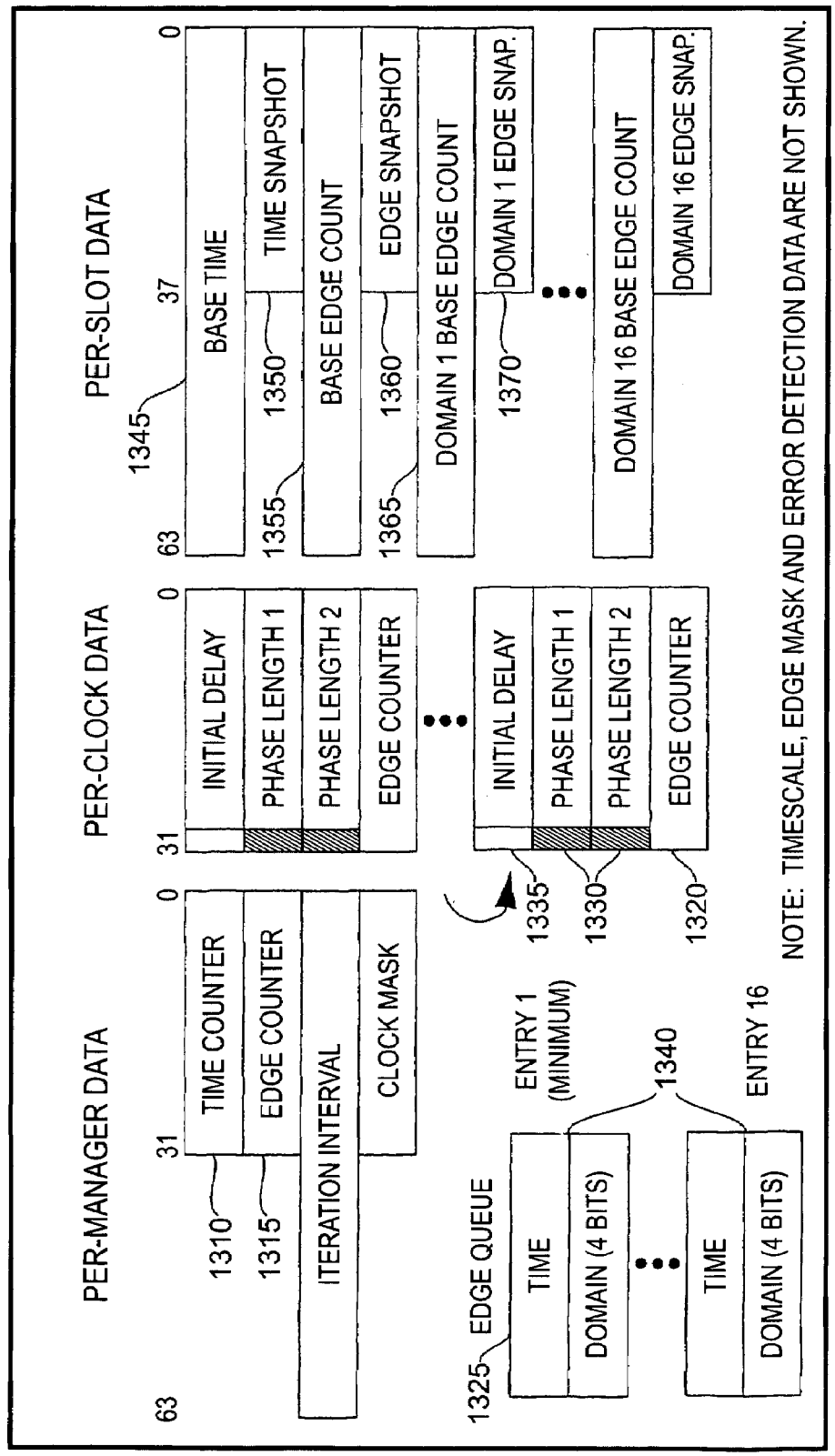
FIG. 13 shows data structures used in the software clock facility of an embodiment of the invention.

The data structures used are shown in FIG. 13. At the center of everything is a time counter 1310. The time counter 1310 counts elapsed time in units specified by the timescale, but does not have a specific reference point from which it counts. Rather, it is the central time counter which serves as a reference for all edges and the current time values in all slots. During the course of a long simulation run, the time counter 1310 may overflow and wrap around. This is understood and handled correctly by the software clock facility, using known methods. A rollover does not affect any user-visible state.

Analogous to the time counter is an edge counter 1315. There is a global edge counter 1315 as well as individual edge counters 1320 for each design clock.

A table of up to 16 entries (for embodiments capable of supporting up to 16 design clocks) stores design clock parameters (including initial value, phase lengths 1330, and the initial delay 1335).

A heap (also known as a priority queue) with a capacity of 16 integer pairs exists to implement the edge queue 1325. Each edge is represented as a (time, domain) pair 1340. The time in the edge refers to the value of the central time counter at which the next edge in the design clock will occur. At any point in time, there is exactly one edge in the queue for each enabled design clock, and the first edge in the queue occurs before or simultaneous with all other edges in the queue (i.e. the queue is a min-heap on the time field).

A table with one row per slot stores a number of time-related values: a base time value 1345, a time counter snapshot value 1350, a base edge count 1355, a global edge counter snapshot 1360 and an edge count 1365 and an edge counter snapshot 1370 for each design clock. These values are used to reconstruct the slot-specific absolute time value and absolute phase counts when requested by a call to CLKgetTime( ) or CLKgetElapsedPhases( ). The design of the iteration algorithms of an embodiment allows these values to be updated when the central time counter rolls over.

A statically allocated tClkMask structure is used to store clock values and communicate the clock state to the caller. A statically allocated 64-bit integer contains interval information used during iteration.

The software clock facility 120 should be efficient since it operates within the tightest loop of the simulation kernel running on the host workstation 105. The software clock facility 120 of an embodiment was designed to support 64-bit time values externally, but the operations which are performed each clock phase use the faster 32-bit operations. This leads the software clock facility 120 to restrict phase lengths to 31 bits.

In alternate embodiments, this restriction is be alleviated by providing two internal functions to advance time: a fast 32-bit one and a slower 64-bit one. The clock manager can set a pointer to the correct function when the clock phase lengths are initially determined.

Time is advanced by processing any clock edges at the current time and then updating the central time counter to either the next edge time or to a limit value, whichever is smaller. The act of processing the edges updates the clock mask to reflect the clock conditions at the new time.

Processing the edges is the most fundamental activity of the clock manager: all edges in the queue which occur at the current time are removed from the queue and for each edge the clock values are updated. When each edge is removed, its opposite edge is inserted into the queue at a time determined by the length of that phase of the clock. A phase length of 0 can cause an edge to be inserted into the queue and then removed later during the same call; the first edge is never seen outside of the time advancing loop. This is a feature which allows efficient iteration for clocks with only one edge.

Advancing time is an O(m×log n) algorithm with very low constant factors, where n is the number of active design clocks and m is the number of edges advanced across. In the disclosed embodiment, both m and n are bounded at 16. In alternate embodiments, m and n may have other bounds as determined by the designer skilled in the art.

Rollover of the central time counter is an infrequent occurrence, but it is checked for when time is advanced. The most efficient mechanism for detecting rollover is to limit the maximum phase length to a 31-bit value. Then after advancing time, a rollover event is signaled in the most-significant bit of the central time counter.

It is possible to create a clock with a single edge by specifying a phase length of 0 for one phase. The algorithm to advance time will handle both edges and only the last (non-zero) edge will be visible to the user. This can be used to make iteration more efficient in a design with a single clock and all edge-triggered devices, but the non-edge clock phase will never be visible to the user.

For example: CLKsetDomainParameters(pClkMgr, 1, 0, clock_period, 1, 0); creates a positive edge-only clock. To make it negative edge, change the initial value 0.s.

When a rollover event is detected, all snapshots of the central time counter (and edge counters) in the slot data table (shown in FIG. 13) are updated from the central counters. The value of the central time counter is subtracted from each edge in the queue, and the counters are reset to 0.

Handling rollovers is an O(n×s) operation, where n is the number of defined design clocks and s is the number of active slots, but the operation's cost is amortized across millions or billions of clock cycles. It is probable that most simulation runs will not invoke the rollover handler at all.

Figure 14:
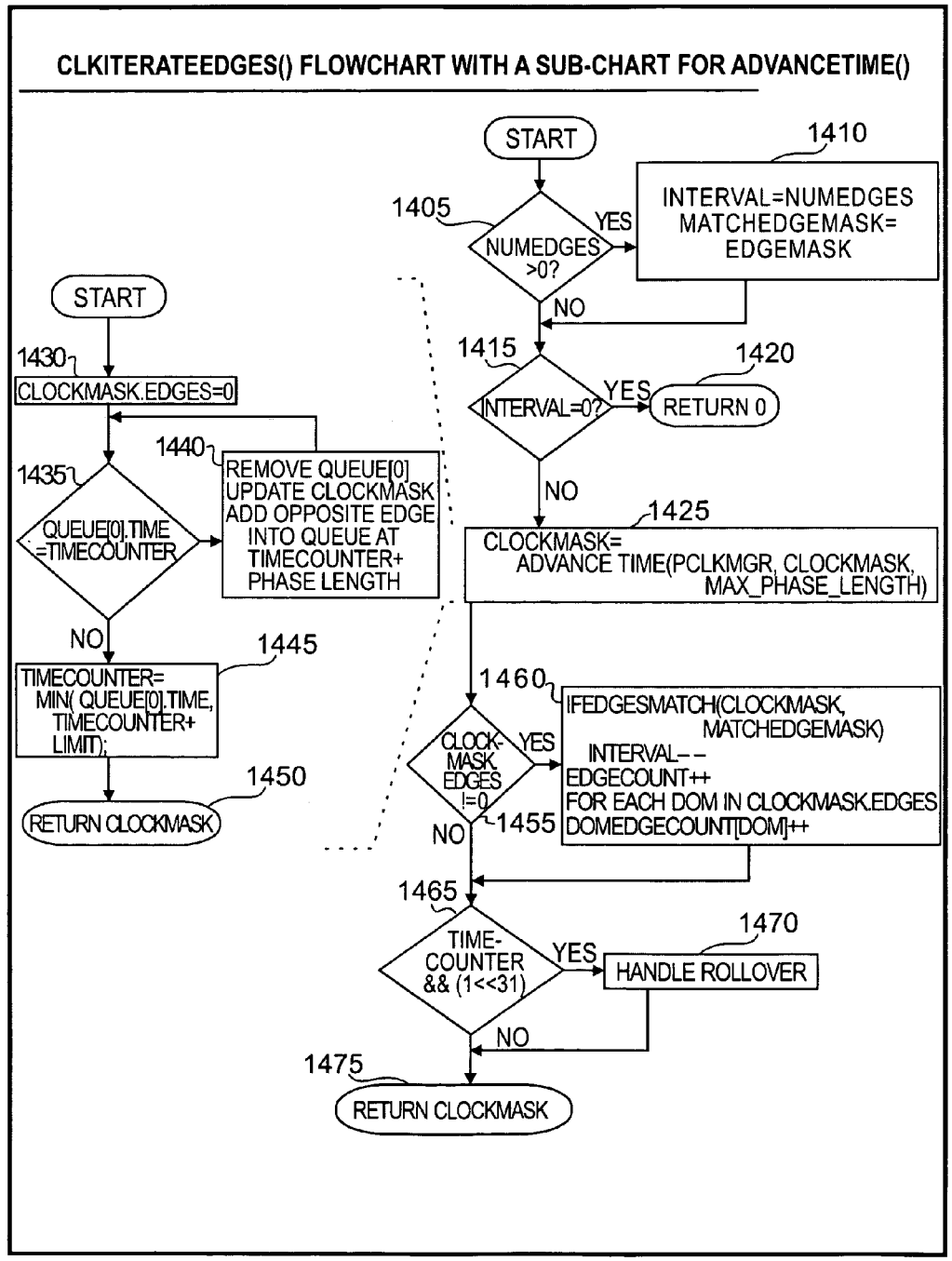
FIG. 14 shows a flowchart of a method of processing design clock edges according to an embodiment of the invention.

To perform an iteration over an interval, the interval must be established using either an edge count (total or domain-specific) or an absolute time duration. Once the interval is established, each call to the iterator (including the one which established the interval) compares the time until the next edge in the queue against the time remaining in the iteration interval (or simply tests if the number of edges left in the interval is 0, if the interval was specified using edge counts). If the edge is determined to belong in the iteration interval, time is advanced, rollover is handled, the iteration interval is updated to reflect the iteration, and the clock mask is returned. If the edge is determined not to belong in the iteration interval, no state is modified and a NULL clock mask pointer is returned. A flowchart for a single iterator call (iterating based on edge counts) is shown in FIG. 14. The time-based iterator is very similar in structure, except that the iteration interval is a time value which tracks the changes in the central time counter to determine when iteration is complete.

Turning to FIG. 14, the method of the iterator call based on edge counts begins at step 1405, where the number of edges remaining in the interval is tested. If the number of edges remaining is not zero, then at step 1410 the interval value is set equal to the number of remaining edges, and the matchEdgeMask is set to equal the edgeMask. At step 1415, the interval value is tested. If the interval is equal to zero, because there were no edges remaining to be processed, then the method returns with a NULL pointer to the clock mask at step 1420. If the interval is non-zero, then there are edges remaining to be processed, and at step 1425 the clockMask is updated to reflect the advance of time, by processing any edges that are on the current clock cycle.

The subroutine for advancing time begins at step 1430, where the clockMask.edges values are initialized to zero. At step 1435, the first edge in the queue is examined to see if it is time to process that edge yet. Since the edges are sorted in ascending order by earliest time, this ensures that all edges due to be processed at the current time are processed. If the process time of the first edge in the queue is equal to the current time, then the edge is processed at step 1440. The edge is removed from the queue, the clockMask is updated to reflect that the specified design clock had an edge triggered, and the opposite edge (low if triggered edge was high, high if triggered edge was low) is added back into the queue at the proper time for the opposite edge to be processed (timeCounter+phase length). Control then returns to step 1435 where the new first edge in the queue is checked. If the phase length of the newly added opposite edge from step 1440 was zero, then the newly added opposite edge is also processed at the current timeCounter value, as discussed above for clocks with zero-length phases.

Once all the edges to be processed at the current timeCounter value have been processed, then at step 1445 the timeCounter is advanced by a number of time units equal to the minimum time until any of the design clocks next has an edge, or the configured limit value, whichever is lower. At step 1450, the subroutine returns the updated clockMask, indicating which clocks changed phase.

At step 1455, the clockMask is tested to see if any of the design clocks changed phase. If so, then at step 1460, if the edges of the clocks that changed phase match the edges configured in the MatchEdgeMask, then the interval value is decremented, as a relevant design clock edge has occurred for the simulation. The global edge counter is incremented, as is the edge counter for each design clock that had an edge processed.

At step 1465, the global time counter is tested to see if it has overflowed. If so, then at step 1470 the overflow is handled, using known methods. At step 1475, the method returns the updated clockMask to the software clock facility 120 for further processing.

During the normal iteration loop of AdvanceTime( ) only 32-bit operations are performed, updating the current time and current edge counts. The computations to determine elapsed time and edges involve 64-bit arithmetic and are therefore performed only when the information is requested (using CLKgetTime( ) or CLKgetElapsedEdges( )). The basic principle is that the base values are full 64-bit values which store a recent value and the snapshot is a copy of the 32-bit counter value at the time when the base value was accurate. Then the true current value can be determined by adding the difference between the current counter value and the snapshot to the base time. This principle is applied to time, global edge counts, and domain-specific edge counts for each slot.

Full 64-bit values for the current time and edge counts are determined using the following formulas:

Elapsed Time(slot)=Base Time(slot)+Current Time−Time Snapshot(slot)

Elapsed Edges(slot)=Base Edge Count(slot)+Current Edge Count−Edge Count Snapshot(slot)

Elapsed Edges(slot, domain)=Base Edge Count(slot, domain)+Current Edge Count (domain)−Edge Count Snapshot(slot, domain)

The software clock facility 120 provides additional API support shown in Table 29 below, to allow the use of external clock generators when it is more efficient, such as the clock generators 210 in the SCM 135 discussed above. Synchronization between the internal and external clock generators is facilitated by the CLKsynchronize( ) function shown in Table 30 below. The function takes a callback as a parameter and makes a number of calls to the callback function. Each callback is both a report on the state of the clock generator and a query for any updated state information from an external source. The caller may supply its own void* which will be passed on to the callback function to provide any data it needs.

TABLE 29

| | |
|---|---|
| PUBLIC | enum tClkSyncQuery_<br>{<br>CSQ_ELAPSED_TIME, CSQ_ELAPSED_EDGES,<br>CSQ_WAVE_PARAMS, CSQ_PHASE_LENGTHS,<br>};<br>typedef enum tClkSyncQuery_ tClkSyncQuery;<br>typedef int (*tClkSyncFn) (tClkSyncQuery query, tUint32 dom,<br>tUint64* pQueryData, void* pUserData); |

Before calling the callback functions, CLKsynchronize( ) updates the base time and edge counts and sets the global time counter to 0, just as if a rollover event occurred. It then calls the callback functions for various state elements of the software clock facility 120 and monitors the values to see if it must handle any value changes from the callbacks.

TABLE 30

| | |
|---|---|
| | Synchronize the clock generator state with an external clock generator. The callback function must conform to the clock synchronizer callback behavior rules. It will be used to query the external environment for the new clock generator state. Returns 0 on success, non-zero otherwise. |
| PUBLIC | int<br>CLKsynchronize( tClockManager* pClkMgr, tClkSyncFn pCallBack, void* pUserData);<br>call the pCallBack function to report and query on each aspect of the clock generator. |

The callback function observes certain guidelines: each time it is called, the pQueryData field will point to a particular piece of clock generator state. It may use that state to update an external clock generator, and it can also update that state from an external clock generator. If the callback returns a non-zero value, this is an error indication. The synchronization call will stop making callbacks and return the error value to its caller. The call-back function should not make any assumptions about the order in which callbacks occur, including the order in which domains of the same query are presented.

The particular nature of the data pointed to by pQuery is indicated by the query argument. Possible values and their meanings are summarized in Table 31 below. Some queries refer to per-clock information; for those queries, the dom argument indicates which design clock is referred to. All queries refer to the first active slot.

TABLE 31

| query | dom | pQueryData points to |
|---|---|---|
| CSQ_ELAPSED_TIME | N/A | The total elapsed time (base time). This is a 64-bit value. |
| CSQ_ELAPSED_EDGES | ANY_DOMAIN | The total edge count (base edge count). This is a 64-bit value. |
| CSQ_ELAPSED_EDGES | 1–16 | The edge count for the specified domain (base edge count). This is a 64-bit value. |

TABLE 31-continued

| query | dom | pQueryData points to |
|---|---|---|
| CSQ_WAVE_PARAMS | 1–16 | The current value for the specified domain is in the 32nd bit. The amount of time until the next edge is in the lower 31 bits. The upper 32 bits are unused. |
| CSQ_PHASE_LENGTHS | 1–16 | The length of the low phase of the specified domain is in the low 32-bit longword, and the length of the high phase is in the high 32-bit longword. |

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense, and the invention is not to be restricted or limited except in accordance with the following claims and their legal equivalents.

We claim:

1. A simulation control module for a simulator, the simulator simulating a design under test, the simulator being controlled by a host workstation, comprising:
one or more clock generators for generating a design clock signal, the design clock signal having at least one design clock phase and a plurality of design clock edges, and
a state machine for managing one or more of the design clock signals;
wherein the simulation control module is implemented in hardware, and
wherein the simulation control module stimulates the design under test for a plurality of clock cycles without intervention from the host workstation;
wherein the state machine comprises:
an idle state;
a running state; and
an aborted state
wherein the running state comprises an oversampling state.

2. The simulation control module of claim 1, wherein the running state further comprises an abort pending state.

3. The simulation control module of claim 1, further comprising an oversampler circuit.

4. The simulation control module of claim 1, wherein the simulation control module further comprises a done circuit.

5. The simulation control module of claim 1, wherein the simulation control module further comprises a mm circuit.

6. The simulation control module of claim 1, wherein the simulation control module further comprises an abort condition tree.

7. The simulation control module of claim 6, wherein the abort condition tree comprises logic for aborting simulation of the design under test so that a software element can be simulated.

8. The simulation control module of claim 1, further comprising bypass logic for bypassing the simulation control module and to provide a clock signal from the host workstation to the design under test.

9. The simulation control module of claim 8, wherein the bypass logic toggles clock phase shifts without intervention from the host workstation.

10. The simulation control module of claim 1, wherein the simulation control module comprises a plurality of clock generators, each for generating an asynchronous design clock signal.

11. The simulation control module of claim 1, wherein the simulation control module simulates fewer than all of the design clock phases.

12. The simulation control module of claim 1, wherein the simulation control module simulates only design clock phases having a design clock edge.

13. The simulation control module of claim 1, wherein the simulation control module allows intervention by the host workstation only upon generation of an abort condition.

14. The simulation control module of claim 1, wherein the simulation control module stimulates the design under test for a plurality of design clock edges without intervention from the host workstation.

15. A simulation control module for a simulator, the simulator simulating a design under test, the simulator being controlled by a host workstation, comprising:
one or more clock generators for generating a design clock signal, the design clock signal having at least one design clock phase and a plurality of design clock edges, and
a state machine for managing one or more of the design clock signals;
wherein the simulation control module is implemented in hardware, and
wherein the simulation control module stimulates the design under test for a plurality of clock cycles without intervention from the host workstation;
wherein the state machine comprises:
an idle state;
a running state;
an aborted state; and
an abort running state.

16. The simulation control module of claim 15, wherein the running state further comprises an abort pending state.

17. The simulation control module of claim 15, further comprising an oversampler circuit.

18. The simulation control module of claim 15, wherein the simulation control module further comprises a done circuit.

19. The simulation control module of claim 15, wherein the simulation control module further comprises a mm circuit.

20. The simulation control module of claim 15, wherein the simulation control module further comprises an abort condition tree.

21. The simulation control module of claim 20, wherein the abort condition tree comprises logic for aborting simulation of the design under test so that a software element can be simulated.

22. The simulation control module of claim 15, further comprising bypass logic for bypassing the simulation control module and to provide a clock signal from the host workstation to the design under test.

23. The simulation control module of claim 22, wherein the bypass logic toggles clock phase shifts without intervention from the host workstation.

24. The simulation control module of claim 15, wherein the simulation control module comprises a plurality of clock generators, each for generating an asynchronous design clock signal.

25. The simulation control module of claim 15, wherein the simulation control module simulates fewer than all of the design clock phases.

26. The simulation control module of claim 15, wherein the simulation control module simulates only design clock phases having a design clock edge.

27. The simulation control module of claim 15, wherein the simulation control module allows intervention by the host workstation only upon generation of an abort condition.

28. The simulation control module of claim 15, wherein the simulation control module stimulates the design under test for a plurality of design clock edges without intervention from the host workstation.

* * * * *